(12) United States Patent
Larkin et al.

(10) Patent No.: US 11,564,044 B2
(45) Date of Patent: *Jan. 24, 2023

(54) DYNAMIC FILTER

(71) Applicant: Earlens Corporation, Menlo Park, CA (US)

(72) Inventors: Brendan Larkin, Menlo Park, CA (US); Xavier Chabot, Dublin, CA (US)

(73) Assignee: Earlens Corporation, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/506,468

(22) Filed: Oct. 20, 2021

(65) Prior Publication Data

US 2022/0046366 A1    Feb. 10, 2022

Related U.S. Application Data

(63) Continuation of application No. 17/066,341, filed on Oct. 8, 2020, now Pat. No. 11,212,626, which is a continuation of application No. PCT/US2019/026352, filed on Apr. 8, 2019.

(60) Provisional application No. 62/655,155, filed on Apr. 9, 2018.

(51) Int. Cl.
*H04R 25/00* (2006.01)

(52) U.S. Cl.
CPC ......... *H04R 25/505* (2013.01); *H04R 25/606* (2013.01)

(58) Field of Classification Search
CPC ...... H04R 3/04; H04R 3/007; H04R 2430/01; H04R 2499/11; H04R 1/22; H04R 2203/12; H04R 2201/403
See application file for complete search history.

(56) References Cited

U.S. PATENT DOCUMENTS

| 2,763,334 A | 9/1956 | Starkey |
| 3,209,082 A | 9/1965 | McCarrell et al. |
| 3,229,049 A | 1/1966 | Goldberg |
| 3,440,314 A | 4/1969 | Eldon |
| 3,449,768 A | 6/1969 | Doyle et al. |
| 3,526,949 A | 9/1970 | Frank |

(Continued)

FOREIGN PATENT DOCUMENTS

| AU | 2004301961 A1 | 2/2005 |
| CA | 2242545 C | 9/2009 |

(Continued)

OTHER PUBLICATIONS

Notice of Allowance dated Aug. 11, 2021 for U.S. Appl. No. 17/066,341.

(Continued)

*Primary Examiner* — Amir H Etesam
(74) *Attorney, Agent, or Firm* — Wilson Sonsini Goodrich & Rosati, P.C.

(57) ABSTRACT

The current invention is intended to render artifacts, which are introduced by changes in coefficients in an FIR filter, inaudible by applying a window to the filtered signal that results in the output of the filter (e.g. FIR filter), in which the coefficients are being changed, supplying little or none of the total output while the output of the filter, in which the coefficients are stable, supplies most or all of the total output.

10 Claims, 11 Drawing Sheets

(56) References Cited

U.S. PATENT DOCUMENTS

| | | |
|---|---|---|
| 3,549,818 A | 12/1970 | Justin |
| 3,585,416 A | 6/1971 | Mellen |
| 3,594,514 A | 7/1971 | Wingrove |
| 3,710,399 A | 1/1973 | Hurst |
| 3,712,962 A | 1/1973 | Epley |
| 3,764,748 A | 10/1973 | Branch et al. |
| 3,808,179 A | 4/1974 | Gaylord |
| 3,870,832 A | 3/1975 | Fredrickson |
| 3,882,285 A | 5/1975 | Nunley et al. |
| 3,965,430 A | 6/1976 | Brandt |
| 3,985,977 A | 10/1976 | Beaty et al. |
| 4,002,897 A | 1/1977 | Kleinman et al. |
| 4,031,318 A | 6/1977 | Pitre |
| 4,061,972 A | 12/1977 | Burgess |
| 4,075,042 A | 2/1978 | Das |
| 4,098,277 A | 7/1978 | Mendell |
| 4,109,116 A | 8/1978 | Victoreen |
| 4,120,570 A | 10/1978 | Gaylord |
| 4,207,441 A | 6/1980 | Ricard et al. |
| 4,248,899 A | 2/1981 | Lyon et al. |
| 4,252,440 A | 2/1981 | Fedors et al. |
| 4,281,419 A | 8/1981 | Treace |
| 4,303,772 A | 12/1981 | Novicky |
| 4,319,359 A | 3/1982 | Wolf |
| 4,334,315 A | 6/1982 | Ono et al. |
| 4,334,321 A | 6/1982 | Edelman |
| 4,338,929 A | 7/1982 | Lundin et al. |
| 4,339,954 A | 7/1982 | Anson et al. |
| 4,357,497 A | 11/1982 | Hochmair et al. |
| 4,375,016 A | 2/1983 | Harada |
| 4,380,689 A | 4/1983 | Giannetti |
| 4,428,377 A | 1/1984 | Zollner et al. |
| 4,524,294 A | 6/1985 | Brody |
| 4,540,761 A | 9/1985 | Kawamura et al. |
| 4,556,122 A | 12/1985 | Goode |
| 4,592,087 A | 5/1986 | Killion |
| 4,606,329 A | 8/1986 | Hough |
| 4,611,598 A | 9/1986 | Hortmann et al. |
| 4,628,907 A | 12/1986 | Epley |
| 4,641,377 A | 2/1987 | Rush et al. |
| 4,652,414 A | 3/1987 | Schlaegel |
| 4,654,554 A | 3/1987 | Kishi |
| 4,689,819 A | 8/1987 | Killion |
| 4,696,287 A | 9/1987 | Hortmann et al. |
| 4,729,366 A | 3/1988 | Schaefer |
| 4,741,339 A | 5/1988 | Harrison et al. |
| 4,742,499 A | 5/1988 | Butler |
| 4,756,312 A | 7/1988 | Epley |
| 4,759,070 A | 7/1988 | Voroba et al. |
| 4,766,607 A | 8/1988 | Feldman |
| 4,774,933 A | 10/1988 | Hough et al. |
| 4,776,322 A | 10/1988 | Hough et al. |
| 4,782,818 A | 11/1988 | Mori |
| 4,800,884 A | 1/1989 | Heide et al. |
| 4,800,982 A | 1/1989 | Carlson |
| 4,817,607 A | 4/1989 | Tatge |
| 4,840,178 A | 6/1989 | Heide et al. |
| 4,845,755 A | 7/1989 | Busch et al. |
| 4,865,035 A | 9/1989 | Mori |
| 4,870,688 A | 9/1989 | Voroba et al. |
| 4,918,745 A | 4/1990 | Hutchison |
| 4,932,405 A | 6/1990 | Peeters et al. |
| 4,936,305 A | 6/1990 | Ashtiani et al. |
| 4,944,301 A | 7/1990 | Widin et al. |
| 4,948,855 A | 8/1990 | Novicky |
| 4,957,478 A | 9/1990 | Maniglia et al. |
| 4,963,963 A | 10/1990 | Dorman |
| 4,982,434 A | 1/1991 | Lenhardt et al. |
| 4,999,819 A | 3/1991 | Newnham et al. |
| 5,003,608 A | 3/1991 | Carlson |
| 5,012,520 A | 4/1991 | Steeger |
| 5,015,224 A | 5/1991 | Maniglia |
| 5,015,225 A | 5/1991 | Hough et al. |
| 5,031,219 A | 7/1991 | Ward et al. |
| 5,061,282 A | 10/1991 | Jacobs |
| 5,066,091 A | 11/1991 | Stoy et al. |
| 5,068,902 A | 11/1991 | Ward |
| 5,094,108 A | 3/1992 | Kim et al. |
| 5,117,461 A | 5/1992 | Moseley |
| 5,142,186 A | 8/1992 | Cross et al. |
| 5,163,957 A | 11/1992 | Sade et al. |
| 5,167,235 A | 12/1992 | Seacord et al. |
| 5,201,007 A | 4/1993 | Ward et al. |
| 5,220,612 A | 6/1993 | Tibbetts et al. |
| 5,259,032 A | 11/1993 | Perkins et al. |
| 5,272,757 A | 12/1993 | Scofield et al. |
| 5,276,910 A | 1/1994 | Buchele |
| 5,277,694 A | 1/1994 | Leysieffer et al. |
| 5,282,858 A | 2/1994 | Bisch et al. |
| 5,296,797 A | 3/1994 | Bartlett |
| 5,298,692 A | 3/1994 | Ikeda et al. |
| 5,338,287 A | 8/1994 | Miller et al. |
| 5,360,388 A | 11/1994 | Spindel et al. |
| 5,378,933 A | 1/1995 | Pfannenmueller et al. |
| 5,402,496 A | 3/1995 | Soli et al. |
| 5,411,467 A | 5/1995 | Hortmann et al. |
| 5,424,698 A | 6/1995 | Dydyk et al. |
| 5,425,104 A | 6/1995 | Shennib |
| 5,440,082 A | 8/1995 | Claes |
| 5,440,237 A | 8/1995 | Brown et al. |
| 5,455,994 A | 10/1995 | Termeer et al. |
| 5,456,654 A | 10/1995 | Ball |
| 5,531,787 A | 7/1996 | Lesinski et al. |
| 5,531,954 A | 7/1996 | Heide et al. |
| 5,535,282 A | 7/1996 | Luca |
| 5,554,096 A | 9/1996 | Ball |
| 5,558,618 A | 9/1996 | Maniglia |
| 5,571,148 A | 11/1996 | Loeb et al. |
| 5,572,594 A | 11/1996 | Devoe et al. |
| 5,606,621 A | 2/1997 | Reiter et al. |
| 5,624,376 A | 4/1997 | Ball et al. |
| 5,654,530 A | 8/1997 | Sauer et al. |
| 5,692,059 A | 11/1997 | Kruger |
| 5,699,809 A | 12/1997 | Combs et al. |
| 5,701,348 A | 12/1997 | Shennib et al. |
| 5,707,338 A | 1/1998 | Adams et al. |
| 5,715,321 A | 2/1998 | Andrea et al. |
| 5,721,783 A | 2/1998 | Anderson |
| 5,722,411 A | 3/1998 | Suzuki et al. |
| 5,729,077 A | 3/1998 | Newnham et al. |
| 5,740,258 A | 4/1998 | Goodwin-Johansson |
| 5,742,692 A | 4/1998 | Garcia et al. |
| 5,749,912 A | 5/1998 | Zhang et al. |
| 5,762,583 A | 6/1998 | Adams et al. |
| 5,772,575 A | 6/1998 | Lesinski et al. |
| 5,774,259 A | 6/1998 | Saitoh et al. |
| 5,782,744 A | 7/1998 | Money |
| 5,788,711 A | 8/1998 | Lehner et al. |
| 5,795,287 A | 8/1998 | Ball et al. |
| 5,797,834 A | 8/1998 | Goode |
| 5,800,336 A | 9/1998 | Ball et al. |
| 5,804,109 A | 9/1998 | Perkins |
| 5,804,907 A | 9/1998 | Park et al. |
| 5,814,095 A | 9/1998 | Mueller et al. |
| 5,824,022 A | 10/1998 | Zilberman et al. |
| 5,825,122 A | 10/1998 | Givargizov et al. |
| 5,836,863 A | 11/1998 | Bushek et al. |
| 5,842,967 A | 12/1998 | Kroll |
| 5,851,199 A | 12/1998 | Peerless et al. |
| 5,857,958 A | 1/1999 | Ball et al. |
| 5,859,916 A | 1/1999 | Ball et al. |
| 5,868,682 A | 2/1999 | Combs et al. |
| 5,879,283 A | 3/1999 | Adams et al. |
| 5,888,187 A | 3/1999 | Jaeger et al. |
| 5,897,486 A | 4/1999 | Ball et al. |
| 5,899,847 A | 5/1999 | Adams et al. |
| 5,900,274 A | 5/1999 | Chatterjee et al. |
| 5,906,635 A | 5/1999 | Maniglia |
| 5,913,815 A | 6/1999 | Ball et al. |
| 5,922,017 A | 7/1999 | Bredberg et al. |
| 5,922,077 A | 7/1999 | Espy et al. |
| 5,935,170 A | 8/1999 | Haakansson et al. |
| 5,940,519 A | 8/1999 | Kuo |
| 5,949,895 A | 9/1999 | Ball et al. |

(56) References Cited

U.S. PATENT DOCUMENTS

| | | |
|---|---|---|
| 5,951,601 A | 9/1999 | Lesinski et al. |
| 5,984,859 A | 11/1999 | Lesinski |
| 5,987,146 A | 11/1999 | Pluvinage et al. |
| 6,001,129 A | 12/1999 | Bushek et al. |
| 6,005,955 A | 12/1999 | Kroll et al. |
| 6,011,984 A | 1/2000 | Van et al. |
| 6,024,717 A | 2/2000 | Ball et al. |
| 6,038,480 A | 3/2000 | Hrdlicka et al. |
| 6,045,528 A | 4/2000 | Arenberg et al. |
| 6,050,933 A | 4/2000 | Bushek et al. |
| 6,067,474 A | 5/2000 | Schulman et al. |
| 6,068,589 A | 5/2000 | Neukermans |
| 6,068,590 A | 5/2000 | Brisken |
| 6,072,884 A | 6/2000 | Kates |
| 6,084,975 A | 7/2000 | Perkins |
| 6,093,144 A | 7/2000 | Jaeger et al. |
| 6,135,612 A | 10/2000 | Clore |
| 6,137,889 A | 10/2000 | Shennib et al. |
| 6,139,488 A | 10/2000 | Ball |
| 6,153,966 A | 11/2000 | Neukermans |
| 6,168,948 B1 | 1/2001 | Anderson et al. |
| 6,174,278 B1 | 1/2001 | Jaeger et al. |
| 6,175,637 B1 | 1/2001 | Fujihira et al. |
| 6,181,801 B1 | 1/2001 | Puthuff et al. |
| 6,190,305 B1 | 2/2001 | Ball et al. |
| 6,190,306 B1 | 2/2001 | Kennedy |
| 6,208,445 B1 | 3/2001 | Reime |
| 6,216,040 B1 | 4/2001 | Harrison |
| 6,217,508 B1 | 4/2001 | Ball et al. |
| 6,219,427 B1 | 4/2001 | Kates et al. |
| 6,222,302 B1 | 4/2001 | Imada et al. |
| 6,222,927 B1 | 4/2001 | Feng et al. |
| 6,240,192 B1 | 5/2001 | Brennan et al. |
| 6,241,767 B1 | 6/2001 | Stennert et al. |
| 6,259,951 B1 | 7/2001 | Kuzma et al. |
| 6,261,224 B1 | 7/2001 | Adams et al. |
| 6,264,603 B1 | 7/2001 | Kennedy |
| 6,277,148 B1 | 8/2001 | Dormer |
| 6,312,959 B1 | 11/2001 | Datskos |
| 6,339,648 B1 | 1/2002 | McIntosh et al. |
| 6,342,035 B1 | 1/2002 | Kroll et al. |
| 6,354,990 B1 | 3/2002 | Juneau et al. |
| 6,359,993 B2 | 3/2002 | Brimhall |
| 6,366,863 B1 | 4/2002 | Bye et al. |
| 6,374,143 B1 | 4/2002 | Berrang et al. |
| 6,385,363 B1 | 5/2002 | Rajic et al. |
| 6,387,039 B1 | 5/2002 | Moses |
| 6,390,971 B1 | 5/2002 | Adams et al. |
| 6,393,130 B1 | 5/2002 | Stonikas et al. |
| 6,422,991 B1 | 7/2002 | Jaeger |
| 6,432,248 B1 | 8/2002 | Popp et al. |
| 6,434,246 B1 | 8/2002 | Kates et al. |
| 6,434,247 B1 | 8/2002 | Kates et al. |
| 6,436,028 B1 | 8/2002 | Dormer |
| 6,438,244 B1 | 8/2002 | Juneau et al. |
| 6,445,799 B1 | 9/2002 | Taenzer et al. |
| 6,473,512 B1 | 10/2002 | Juneau et al. |
| 6,475,134 B1 | 11/2002 | Ball et al. |
| 6,491,622 B1 | 12/2002 | Kasic, II et al. |
| 6,491,644 B1 | 12/2002 | Vujanic et al. |
| 6,491,722 B1 | 12/2002 | Kroll et al. |
| 6,493,453 B1 | 12/2002 | Glendon |
| 6,493,454 B1 | 12/2002 | Loi et al. |
| 6,498,858 B2 | 12/2002 | Kates |
| 6,507,758 B1 | 1/2003 | Greenberg et al. |
| 6,519,376 B2 | 2/2003 | Biagi et al. |
| 6,523,985 B2 | 2/2003 | Hamanaka et al. |
| 6,536,530 B2 | 3/2003 | Schultz et al. |
| 6,537,200 B2 | 3/2003 | Leysieffer et al. |
| 6,547,715 B1 | 4/2003 | Mueller et al. |
| 6,549,633 B1 | 4/2003 | Westermann |
| 6,549,635 B1 | 4/2003 | Gebert |
| 6,554,761 B1 | 4/2003 | Puria et al. |
| 6,575,894 B2 | 6/2003 | Leysieffer et al. |
| 6,592,513 B1 | 7/2003 | Kroll et al. |
| 6,603,860 B1 | 8/2003 | Taenzer et al. |
| 6,620,110 B2 | 9/2003 | Schmid |
| 6,626,822 B1 | 9/2003 | Jaeger et al. |
| 6,629,922 B1 | 10/2003 | Puria et al. |
| 6,631,196 B1 | 10/2003 | Taenzer et al. |
| 6,643,378 B2 | 11/2003 | Schumaier |
| 6,663,575 B2 | 12/2003 | Leysieffer |
| 6,668,062 B1 | 12/2003 | Luo et al. |
| 6,676,592 B2 | 1/2004 | Ball et al. |
| 6,681,022 B1 | 1/2004 | Puthuff et al. |
| 6,695,943 B2 | 2/2004 | Juneau et al. |
| 6,697,674 B2 | 2/2004 | Leysieffer |
| 6,724,902 B1 | 4/2004 | Shennib et al. |
| 6,726,618 B2 | 4/2004 | Miller |
| 6,726,718 B1 | 4/2004 | Carlyle et al. |
| 6,727,789 B2 | 4/2004 | Tibbetts et al. |
| 6,728,024 B2 | 4/2004 | Ribak |
| 6,735,318 B2 | 5/2004 | Cho |
| 6,754,358 B1 | 6/2004 | Boesen et al. |
| 6,754,359 B1 | 6/2004 | Svean et al. |
| 6,754,537 B1 | 6/2004 | Harrison et al. |
| 6,785,394 B1 | 8/2004 | Olsen et al. |
| 6,792,114 B1 | 9/2004 | Kates et al. |
| 6,801,629 B2 | 10/2004 | Brimhall et al. |
| 6,829,363 B2 | 12/2004 | Sacha |
| 6,831,986 B2 | 12/2004 | Kates |
| 6,837,857 B2 | 1/2005 | Stirnemann |
| 6,842,647 B1 | 1/2005 | Griffith et al. |
| 6,888,949 B1 | 5/2005 | Vanden et al. |
| 6,900,926 B2 | 5/2005 | Ribak |
| 6,912,289 B2 | 6/2005 | Vonlanthen et al. |
| 6,920,340 B2 | 7/2005 | Laderman |
| 6,931,231 B1 | 8/2005 | Griffin |
| 6,940,988 B1 | 9/2005 | Shennib et al. |
| 6,940,989 B1 | 9/2005 | Shennib et al. |
| 6,942,989 B2 | 9/2005 | Felkner et al. |
| D512,979 S | 12/2005 | Corcoran et al. |
| 6,975,402 B2 | 12/2005 | Bisson et al. |
| 6,978,159 B2 | 12/2005 | Feng et al. |
| 7,020,297 B2 | 3/2006 | Fang et al. |
| 7,024,010 B2 | 4/2006 | Saunders et al. |
| 7,043,037 B2 | 5/2006 | Lichtblau et al. |
| 7,050,675 B2 | 5/2006 | Zhou et al. |
| 7,050,876 B1 | 5/2006 | Fu et al. |
| 7,057,256 B2 | 6/2006 | Mazur et al. |
| 7,058,182 B2 | 6/2006 | Kates |
| 7,058,188 B1 | 6/2006 | Allred |
| 7,072,475 B1 | 7/2006 | Denap et al. |
| 7,076,076 B2 | 7/2006 | Bauman |
| 7,095,981 B1 | 8/2006 | Voroba et al. |
| 7,167,572 B1 | 1/2007 | Harrison et al. |
| 7,174,026 B2 | 2/2007 | Niederdrank et al. |
| 7,179,238 B2 | 2/2007 | Hissong |
| 7,181,034 B2 | 2/2007 | Armstrong |
| 7,203,331 B2 | 4/2007 | Boesen |
| 7,239,069 B2 | 7/2007 | Cho |
| 7,245,732 B2 | 7/2007 | Jorgensen et al. |
| 7,255,457 B2 | 8/2007 | Ducharme et al. |
| 7,266,208 B2 | 9/2007 | Charvin et al. |
| 7,289,639 B2 | 10/2007 | Abel et al. |
| 7,313,245 B1 | 12/2007 | Shennib |
| 7,315,211 B1 | 1/2008 | Lee et al. |
| 7,322,930 B2 | 1/2008 | Jaeger et al. |
| 7,349,741 B2 | 3/2008 | Maltan et al. |
| 7,354,792 B2 | 4/2008 | Mazur et al. |
| 7,376,563 B2 | 5/2008 | Leysieffer et al. |
| 7,390,689 B2 | 6/2008 | Mazur et al. |
| 7,394,909 B1 | 7/2008 | Widmer et al. |
| 7,421,087 B2 | 9/2008 | Perkins et al. |
| 7,424,122 B2 | 9/2008 | Ryan |
| 7,444,877 B2 | 11/2008 | Li et al. |
| 7,547,275 B2 | 6/2009 | Cho et al. |
| 7,630,646 B2 | 12/2009 | Anderson et al. |
| 7,645,877 B2 | 1/2010 | Gmeiner et al. |
| 7,668,325 B2 | 2/2010 | Puria et al. |
| 7,747,295 B2 | 6/2010 | Choi |
| 7,778,434 B2 | 8/2010 | Juneau et al. |
| 7,809,150 B2 | 10/2010 | Natarajan et al. |
| 7,822,215 B2 | 10/2010 | Carazo et al. |

(56) References Cited

U.S. PATENT DOCUMENTS

| | | |
|---|---|---|
| 7,826,632 B2 | 11/2010 | Von Buol et al. |
| 7,853,033 B2 | 12/2010 | Maltan et al. |
| 7,867,160 B2 | 1/2011 | Pluvinage et al. |
| 7,883,535 B2 | 2/2011 | Cantin et al. |
| 7,885,359 B2 | 2/2011 | Meltzer |
| 7,955,249 B2 | 6/2011 | Perkins et al. |
| 7,983,435 B2 | 7/2011 | Moses |
| 8,090,134 B2 | 1/2012 | Takigawa et al. |
| 8,099,169 B1 | 1/2012 | Karunasiri |
| 8,116,494 B2 | 2/2012 | Rass |
| 8,128,551 B2 | 3/2012 | Jolly |
| 8,157,730 B2 | 4/2012 | LeBoeuf et al. |
| 8,197,461 B1 | 6/2012 | Arenberg et al. |
| 8,204,786 B2 | 6/2012 | LeBoeuf et al. |
| 8,233,651 B1 | 7/2012 | Haller |
| 8,251,903 B2 | 8/2012 | LeBoeuf et al. |
| 8,284,970 B2 | 10/2012 | Sacha |
| 8,295,505 B2 | 10/2012 | Weinans et al. |
| 8,295,523 B2 | 10/2012 | Fay et al. |
| 8,320,601 B2 | 11/2012 | Takigawa et al. |
| 8,320,982 B2 | 11/2012 | LeBoeuf et al. |
| 8,340,310 B2 | 12/2012 | Ambrose et al. |
| 8,340,335 B1 | 12/2012 | Shennib |
| 8,391,527 B2 | 3/2013 | Feucht et al. |
| 8,396,235 B2 | 3/2013 | Gebhardt et al. |
| 8,396,239 B2 | 3/2013 | Fay et al. |
| 8,401,212 B2 | 3/2013 | Puria et al. |
| 8,401,214 B2 | 3/2013 | Perkins et al. |
| 8,506,473 B2 | 8/2013 | Puria |
| 8,512,242 B2 | 8/2013 | LeBoeuf et al. |
| 8,526,651 B2 | 9/2013 | Lafort et al. |
| 8,526,652 B2 | 9/2013 | Ambrose et al. |
| 8,526,971 B2 | 9/2013 | Giniger et al. |
| 8,545,383 B2 | 10/2013 | Wenzel et al. |
| 8,600,089 B2 | 12/2013 | Wenzel et al. |
| 8,647,270 B2 | 2/2014 | LeBoeuf et al. |
| 8,652,040 B2 | 2/2014 | LeBoeuf et al. |
| 8,684,922 B2 | 4/2014 | Tran |
| 8,696,054 B2 | 4/2014 | Crum |
| 8,696,541 B2 | 4/2014 | Pluvinage et al. |
| 8,700,111 B2 | 4/2014 | LeBoeuf et al. |
| 8,702,607 B2 | 4/2014 | LeBoeuf et al. |
| 8,715,152 B2 | 5/2014 | Puria et al. |
| 8,715,153 B2 | 5/2014 | Puria et al. |
| 8,715,154 B2 | 5/2014 | Perkins et al. |
| 8,761,423 B2 | 6/2014 | Wagner et al. |
| 8,787,609 B2 | 7/2014 | Perkins et al. |
| 8,788,002 B2 | 7/2014 | LeBoeuf et al. |
| 8,817,998 B2 | 8/2014 | Inoue |
| 8,824,715 B2 | 9/2014 | Fay et al. |
| 8,837,758 B2 | 9/2014 | Knudsen |
| 8,845,705 B2 | 9/2014 | Perkins et al. |
| 8,855,323 B2 | 10/2014 | Kroman |
| 8,858,419 B2 | 10/2014 | Puria et al. |
| 8,885,860 B2 | 11/2014 | Djalilian et al. |
| 8,886,269 B2 | 11/2014 | LeBoeuf et al. |
| 8,888,701 B2 | 11/2014 | LeBoeuf et al. |
| 8,923,941 B2 | 12/2014 | LeBoeuf et al. |
| 8,929,965 B2 | 1/2015 | LeBoeuf et al. |
| 8,929,966 B2 | 1/2015 | LeBoeuf et al. |
| 8,934,952 B2 | 1/2015 | LeBoeuf et al. |
| 8,942,776 B2 | 1/2015 | LeBoeuf et al. |
| 8,961,415 B2 | 2/2015 | LeBoeuf et al. |
| 8,986,187 B2 | 3/2015 | Perkins et al. |
| 8,989,830 B2 | 3/2015 | LeBoeuf et al. |
| 9,044,180 B2 | 6/2015 | LeBoeuf et al. |
| 9,049,528 B2 | 6/2015 | Fay et al. |
| 9,055,379 B2 | 6/2015 | Puria et al. |
| 9,131,312 B2 | 9/2015 | LeBoeuf et al. |
| 9,154,891 B2 | 10/2015 | Puria et al. |
| 9,211,069 B2 | 12/2015 | Larsen et al. |
| 9,226,083 B2 | 12/2015 | Puria et al. |
| 9,277,335 B2 | 3/2016 | Perkins et al. |
| 9,289,135 B2 | 3/2016 | LeBoeuf et al. |
| 9,289,175 B2 | 3/2016 | LeBoeuf et al. |
| 9,301,696 B2 | 4/2016 | LeBoeuf et al. |
| 9,314,167 B2 | 4/2016 | LeBoeuf et al. |
| 9,392,377 B2 | 7/2016 | Olsen et al. |
| 9,427,191 B2 | 8/2016 | LeBoeuf |
| 9,497,556 B2 | 11/2016 | Kaltenbacher et al. |
| 9,521,962 B2 | 12/2016 | LeBoeuf |
| 9,524,092 B2 | 12/2016 | Ren et al. |
| 9,538,921 B2 | 1/2017 | LeBoeuf et al. |
| 9,544,675 B2 | 1/2017 | Facteau et al. |
| 9,544,700 B2 | 1/2017 | Puria et al. |
| 9,564,862 B2 | 2/2017 | Hoyerby |
| 9,591,409 B2 | 3/2017 | Puria et al. |
| 9,749,758 B2 | 8/2017 | Puria et al. |
| 9,750,462 B2 | 9/2017 | LeBoeuf et al. |
| 9,788,785 B2 | 10/2017 | LeBoeuf |
| 9,788,794 B2 | 10/2017 | LeBoeuf et al. |
| 9,794,653 B2 | 10/2017 | Aumer et al. |
| 9,794,688 B2 * | 10/2017 | You .......................... H04R 3/04 |
| 9,801,552 B2 | 10/2017 | Romesburg |
| 9,808,204 B2 | 11/2017 | LeBoeuf et al. |
| 9,924,276 B2 | 3/2018 | Wenzel |
| 9,930,458 B2 | 3/2018 | Freed et al. |
| 9,949,035 B2 | 4/2018 | Rucker et al. |
| 9,949,039 B2 | 4/2018 | Perkins et al. |
| 9,949,045 B2 | 4/2018 | Kure et al. |
| 9,961,454 B2 | 5/2018 | Puria et al. |
| 9,964,672 B2 | 5/2018 | Phair et al. |
| 10,003,888 B2 | 6/2018 | Stephanou et al. |
| 10,034,103 B2 | 7/2018 | Puria et al. |
| 10,143,592 B2 | 12/2018 | Goldstein |
| 10,154,352 B2 | 12/2018 | Perkins et al. |
| 10,178,483 B2 | 1/2019 | Teran et al. |
| 10,206,045 B2 | 2/2019 | Kaltenbacher et al. |
| 10,237,663 B2 | 3/2019 | Puria et al. |
| 10,284,964 B2 | 5/2019 | Olsen et al. |
| 10,286,215 B2 | 5/2019 | Perkins et al. |
| 10,292,601 B2 | 5/2019 | Perkins et al. |
| 10,306,381 B2 | 5/2019 | Sandhu et al. |
| 10,492,010 B2 | 11/2019 | Rucker et al. |
| 10,511,913 B2 | 12/2019 | Puria et al. |
| 10,516,946 B2 | 12/2019 | Puria et al. |
| 10,516,949 B2 | 12/2019 | Puria et al. |
| 10,516,950 B2 | 12/2019 | Perkins et al. |
| 10,516,951 B2 | 12/2019 | Wenzel |
| 10,531,206 B2 | 1/2020 | Freed et al. |
| 10,555,100 B2 | 2/2020 | Perkins et al. |
| 10,609,492 B2 | 3/2020 | Olsen et al. |
| 10,743,110 B2 | 8/2020 | Puria et al. |
| 10,779,094 B2 | 9/2020 | Rucker et al. |
| 10,863,286 B2 | 12/2020 | Perkins et al. |
| 11,057,714 B2 | 7/2021 | Puria et al. |
| 11,058,305 B2 | 7/2021 | Perkins et al. |
| 11,070,927 B2 | 7/2021 | Rucker et al. |
| 11,102,594 B2 | 8/2021 | Shaquer et al. |
| 11,153,697 B2 | 10/2021 | Olsen et al. |
| 11,166,114 B2 | 11/2021 | Perkins et al. |
| 11,212,626 B2 | 12/2021 | Larkin et al. |
| 11,252,516 B2 | 2/2022 | Wenzel |
| 11,259,129 B2 | 2/2022 | Freed et al. |
| 11,310,605 B2 | 4/2022 | Puria et al. |
| 11,317,224 B2 | 4/2022 | Puria |
| 11,337,012 B2 | 5/2022 | Atamaniuk et al. |
| 11,350,226 B2 | 5/2022 | Sandhu et al. |
| 2001/0003788 A1 | 6/2001 | Ball et al. |
| 2001/0007050 A1 | 7/2001 | Adelman |
| 2001/0024507 A1 | 9/2001 | Boesen |
| 2001/0027342 A1 | 10/2001 | Dormer |
| 2001/0029313 A1 | 10/2001 | Kennedy |
| 2001/0053871 A1 | 12/2001 | Zilberman et al. |
| 2002/0025055 A1 | 2/2002 | Stonikas et al. |
| 2002/0035309 A1 | 3/2002 | Leysieffer |
| 2002/0048374 A1 | 4/2002 | Soli et al. |
| 2002/0085728 A1 | 7/2002 | Shennib et al. |
| 2002/0086715 A1 | 7/2002 | Sahagen |
| 2002/0172350 A1 | 11/2002 | Edwards et al. |
| 2002/0183587 A1 | 12/2002 | Dormer |
| 2003/0021903 A1 | 1/2003 | Shlenker et al. |
| 2003/0055311 A1 | 3/2003 | Neukermans et al. |
| 2003/0064746 A1 | 4/2003 | Rader et al. |

(56) References Cited

U.S. PATENT DOCUMENTS

| | | |
|---|---|---|
| 2003/0081803 A1 | 5/2003 | Petilli et al. |
| 2003/0097178 A1 | 5/2003 | Roberson et al. |
| 2003/0125602 A1 | 7/2003 | Sokolich et al. |
| 2003/0142841 A1 | 7/2003 | Wiegand |
| 2003/0208099 A1 | 11/2003 | Ball |
| 2003/0208888 A1 | 11/2003 | Fearing et al. |
| 2004/0093040 A1 | 5/2004 | Boylston et al. |
| 2004/0121291 A1 | 6/2004 | Knapp et al. |
| 2004/0158157 A1 | 8/2004 | Jensen et al. |
| 2004/0165742 A1 | 8/2004 | Shennib et al. |
| 2004/0166495 A1 | 8/2004 | Greinwald, Jr. et al. |
| 2004/0167377 A1 | 8/2004 | Schafer et al. |
| 2004/0190734 A1 | 9/2004 | Kates |
| 2004/0202339 A1 | 10/2004 | O'Brien, Jr. et al. |
| 2004/0202340 A1 | 10/2004 | Armstrong et al. |
| 2004/0208333 A1 | 10/2004 | Cheung et al. |
| 2004/0234089 A1 | 11/2004 | Rembrand et al. |
| 2004/0234092 A1 | 11/2004 | Wada et al. |
| 2004/0236416 A1 | 11/2004 | Falotico |
| 2004/0240691 A1 | 12/2004 | Grafenberg |
| 2005/0018859 A1 | 1/2005 | Buchholz |
| 2005/0020873 A1 | 1/2005 | Berrang et al. |
| 2005/0036639 A1 | 2/2005 | Bachler et al. |
| 2005/0038498 A1 | 2/2005 | Dubrow et al. |
| 2005/0088435 A1 | 4/2005 | Geng |
| 2005/0101830 A1 | 5/2005 | Easter et al. |
| 2005/0111683 A1 | 5/2005 | Chabries et al. |
| 2005/0117765 A1 | 6/2005 | Meyer et al. |
| 2005/0190939 A1 | 9/2005 | Fretz |
| 2005/0196005 A1 | 9/2005 | Shennib et al. |
| 2005/0222823 A1 | 10/2005 | Brumback et al. |
| 2005/0226446 A1 | 10/2005 | Luo et al. |
| 2005/0267549 A1 | 12/2005 | Della et al. |
| 2005/0271870 A1 | 12/2005 | Jackson |
| 2005/0288739 A1 | 12/2005 | Hassler, Jr. et al. |
| 2006/0058573 A1 | 3/2006 | Neisz et al. |
| 2006/0062420 A1 | 3/2006 | Araki |
| 2006/0074159 A1 | 4/2006 | Lu et al. |
| 2006/0075175 A1 | 4/2006 | Jensen et al. |
| 2006/0161227 A1 | 7/2006 | Walsh et al. |
| 2006/0161255 A1 | 7/2006 | Zarowski et al. |
| 2006/0177079 A1 | 8/2006 | Baekgaard et al. |
| 2006/0177082 A1 | 8/2006 | Solomito et al. |
| 2006/0183965 A1 | 8/2006 | Kasic et al. |
| 2006/0231914 A1 | 10/2006 | Carey et al. |
| 2006/0233398 A1 | 10/2006 | Husung |
| 2006/0237126 A1 | 10/2006 | Guffrey et al. |
| 2006/0247735 A1 | 11/2006 | Honert et al. |
| 2006/0256989 A1 | 11/2006 | Olsen et al. |
| 2006/0278245 A1 | 12/2006 | Gan |
| 2007/0030990 A1 | 2/2007 | Fischer |
| 2007/0036377 A1 | 2/2007 | Stirnemann |
| 2007/0076913 A1 | 4/2007 | Schanz |
| 2007/0083078 A1 | 4/2007 | Easter et al. |
| 2007/0127748 A1 | 6/2007 | Carlile et al. |
| 2007/0127752 A1 | 6/2007 | Armstrong |
| 2007/0127766 A1 | 6/2007 | Combest |
| 2007/0135870 A1 | 6/2007 | Shanks et al. |
| 2007/0161848 A1 | 7/2007 | Dalton et al. |
| 2007/0191673 A1 | 8/2007 | Ball et al. |
| 2007/0201713 A1 | 8/2007 | Fang et al. |
| 2007/0206825 A1 | 9/2007 | Thomasson |
| 2007/0223755 A1 | 9/2007 | Salvetti et al. |
| 2007/0225776 A1 | 9/2007 | Fritsch et al. |
| 2007/0236704 A1 | 10/2007 | Carr et al. |
| 2007/0250119 A1 | 10/2007 | Tyler et al. |
| 2007/0251082 A1 | 11/2007 | Milojevic et al. |
| 2007/0258507 A1 | 11/2007 | Lee et al. |
| 2007/0286429 A1 | 12/2007 | Grafenberg et al. |
| 2008/0021518 A1 | 1/2008 | Hochmair et al. |
| 2008/0051623 A1 | 2/2008 | Schneider et al. |
| 2008/0054509 A1 | 3/2008 | Berman et al. |
| 2008/0063228 A1 | 3/2008 | Mejia et al. |
| 2008/0063231 A1 | 3/2008 | Juneau et al. |
| 2008/0077198 A1 | 3/2008 | Webb et al. |
| 2008/0089292 A1 | 4/2008 | Kitazoe et al. |
| 2008/0107292 A1 | 5/2008 | Kornagel |
| 2008/0123866 A1 | 5/2008 | Rule et al. |
| 2008/0130927 A1 | 6/2008 | Theverapperuma et al. |
| 2008/0188707 A1 | 8/2008 | Bernard et al. |
| 2008/0298600 A1 | 12/2008 | Poe et al. |
| 2008/0300703 A1 | 12/2008 | Widmer et al. |
| 2009/0016553 A1 | 1/2009 | Ho et al. |
| 2009/0023976 A1 | 1/2009 | Cho et al. |
| 2009/0043149 A1 | 2/2009 | Abel et al. |
| 2009/0076581 A1 | 3/2009 | Gibson |
| 2009/0131742 A1 | 5/2009 | Cho et al. |
| 2009/0141919 A1 | 6/2009 | Spitaels et al. |
| 2009/0149697 A1 | 6/2009 | Steinhardt et al. |
| 2009/0157143 A1 | 6/2009 | Edler et al. |
| 2009/0175474 A1 | 7/2009 | Salvetti et al. |
| 2009/0246627 A1 | 10/2009 | Park |
| 2009/0253951 A1 | 10/2009 | Ball et al. |
| 2009/0262966 A1 | 10/2009 | Vestergaard et al. |
| 2009/0281367 A1 | 11/2009 | Cho et al. |
| 2009/0310805 A1 | 12/2009 | Petroff |
| 2009/0316922 A1 | 12/2009 | Merks et al. |
| 2010/0036488 A1 | 2/2010 | De, Jr. et al. |
| 2010/0085176 A1 | 4/2010 | Flick |
| 2010/0103404 A1 | 4/2010 | Remke et al. |
| 2010/0114190 A1 | 5/2010 | Bendett et al. |
| 2010/0145135 A1 | 6/2010 | Ball et al. |
| 2010/0171369 A1 | 7/2010 | Baarman et al. |
| 2010/0172507 A1 | 7/2010 | Merks |
| 2010/0177918 A1 | 7/2010 | Keady et al. |
| 2010/0222639 A1 | 9/2010 | Purcell et al. |
| 2010/0260364 A1 | 10/2010 | Merks |
| 2010/0272299 A1 | 10/2010 | Van Schuylenbergh et al. |
| 2010/0290653 A1 | 11/2010 | Wiggins et al. |
| 2010/0322452 A1 | 12/2010 | Ladabaum et al. |
| 2011/0062793 A1 | 3/2011 | Azancot et al. |
| 2011/0069852 A1 | 3/2011 | Arndt et al. |
| 2011/0084654 A1 | 4/2011 | Julstrom et al. |
| 2011/0112462 A1 | 5/2011 | Parker et al. |
| 2011/0116666 A1 | 5/2011 | Dittberner et al. |
| 2011/0125222 A1 | 5/2011 | Perkins et al. |
| 2011/0130622 A1 | 6/2011 | Ilberg et al. |
| 2011/0144414 A1 | 6/2011 | Spearman et al. |
| 2011/0164771 A1 | 7/2011 | Jensen et al. |
| 2011/0196460 A1 | 8/2011 | Weiss |
| 2011/0221391 A1 | 9/2011 | Won et al. |
| 2011/0249845 A1 | 10/2011 | Kates |
| 2011/0249847 A1 | 10/2011 | Salvetti et al. |
| 2011/0257290 A1 | 10/2011 | Zeller et al. |
| 2011/0258839 A1 | 10/2011 | Probst |
| 2011/0271965 A1 | 11/2011 | Parkins et al. |
| 2012/0008807 A1 | 1/2012 | Gran |
| 2012/0038881 A1 | 2/2012 | Amirparviz et al. |
| 2012/0039493 A1 | 2/2012 | Rucker et al. |
| 2012/0092461 A1 | 4/2012 | Fisker et al. |
| 2012/0114157 A1 | 5/2012 | Arndt et al. |
| 2012/0140967 A1 | 6/2012 | Aubert et al. |
| 2012/0217087 A1 | 8/2012 | Ambrose et al. |
| 2012/0236524 A1 | 9/2012 | Pugh et al. |
| 2012/0263339 A1 | 10/2012 | Funahashi |
| 2013/0004004 A1 | 1/2013 | Zhao et al. |
| 2013/0034258 A1 | 2/2013 | Lin |
| 2013/0083938 A1 | 4/2013 | Bakalos et al. |
| 2013/0089227 A1 | 4/2013 | Kates |
| 2013/0195300 A1 | 8/2013 | Larsen et al. |
| 2013/0230204 A1 | 9/2013 | Monahan et al. |
| 2013/0303835 A1 | 11/2013 | Koskowich |
| 2013/0308782 A1 | 11/2013 | Dittberner et al. |
| 2013/0308807 A1 | 11/2013 | Burns |
| 2013/0343584 A1 | 12/2013 | Bennett et al. |
| 2013/0343585 A1 | 12/2013 | Bennett et al. |
| 2013/0343587 A1 | 12/2013 | Naylor et al. |
| 2014/0084698 A1 | 3/2014 | Asanuma et al. |
| 2014/0107423 A1 | 4/2014 | Yaacobi |
| 2014/0153761 A1 | 6/2014 | Shennib et al. |
| 2014/0169603 A1 | 6/2014 | Sacha et al. |
| 2014/0177863 A1 | 6/2014 | Parkins |
| 2014/0194891 A1 | 7/2014 | Shahoian |
| 2014/0254856 A1 | 9/2014 | Blick et al. |

(56) References Cited

U.S. PATENT DOCUMENTS

| | | |
|---|---|---|
| 2014/0286514 A1 | 9/2014 | Pluvinage et al. |
| 2014/0288356 A1 | 9/2014 | Van Vlem |
| 2014/0288358 A1 | 9/2014 | Puria et al. |
| 2014/0296620 A1 | 10/2014 | Puria et al. |
| 2014/0321657 A1 | 10/2014 | Stirnemann |
| 2014/0379874 A1 | 12/2014 | Starr et al. |
| 2015/0021568 A1 | 1/2015 | Gong et al. |
| 2015/0049889 A1 | 2/2015 | Bern |
| 2015/0117689 A1 | 4/2015 | Bergs et al. |
| 2015/0124985 A1 | 5/2015 | Kim et al. |
| 2015/0201269 A1 | 7/2015 | Dahl |
| 2015/0222978 A1 | 8/2015 | Murozaki |
| 2015/0358743 A1 | 12/2015 | Killion |
| 2016/0008176 A1 | 1/2016 | Goldstein |
| 2016/0064814 A1 | 3/2016 | Jang et al. |
| 2016/0087687 A1 | 3/2016 | Kesler et al. |
| 2016/0094043 A1 | 3/2016 | Hao et al. |
| 2016/0277854 A1 | 9/2016 | Puria et al. |
| 2016/0309265 A1 | 10/2016 | Pluvinage et al. |
| 2016/0309266 A1 | 10/2016 | Olsen et al. |
| 2016/0330555 A1 | 11/2016 | Vonlanthen et al. |
| 2017/0040012 A1 | 2/2017 | Goldstein |
| 2017/0095202 A1 | 4/2017 | Facteau et al. |
| 2017/0180888 A1 | 6/2017 | Andersson et al. |
| 2017/0195806 A1 | 7/2017 | Atamaniuk et al. |
| 2017/0257710 A1 | 9/2017 | Parker |
| 2018/0077503 A1 | 3/2018 | Shaquer et al. |
| 2018/0077504 A1 | 3/2018 | Shaquer et al. |
| 2018/0213331 A1 | 7/2018 | Rucker et al. |
| 2018/0262846 A1 | 9/2018 | Perkins et al. |
| 2018/0317026 A1 | 11/2018 | Puria |
| 2018/0376255 A1 | 12/2018 | Parker |
| 2019/0166438 A1 | 5/2019 | Perkins et al. |
| 2019/0253811 A1 | 8/2019 | Unno et al. |
| 2019/0253815 A1 | 8/2019 | Atamaniuk et al. |
| 2020/0037082 A1 | 1/2020 | Perkins et al. |
| 2020/0128338 A1 | 4/2020 | Shaquer et al. |
| 2020/0186942 A1 | 6/2020 | Flaherty et al. |
| 2020/0336843 A1 | 10/2020 | Lee et al. |
| 2020/0396551 A1 | 12/2020 | Dy et al. |
| 2021/0029451 A1 | 1/2021 | Fitz et al. |
| 2021/0186343 A1 | 6/2021 | Perkins et al. |
| 2021/0266686 A1 | 8/2021 | Puria et al. |
| 2021/0274293 A1 | 9/2021 | Perkins et al. |
| 2021/0306777 A1 | 9/2021 | Rucker et al. |
| 2021/0314712 A1 | 10/2021 | Shaquer et al. |
| 2021/0392449 A1 | 12/2021 | Flaherty et al. |
| 2021/0400405 A1 | 12/2021 | Perkins et al. |
| 2022/0007114 A1 | 1/2022 | Perkins et al. |
| 2022/0007115 A1 | 1/2022 | Perkins et al. |
| 2022/0007118 A1 | 1/2022 | Rucker et al. |
| 2022/0007120 A1 | 1/2022 | Olsen et al. |
| 2022/0086572 A1 | 3/2022 | Flaherty et al. |
| 2022/0150650 A1 | 5/2022 | Rucker |

FOREIGN PATENT DOCUMENTS

| | | | |
|---|---|---|---|
| CN | 1176731 | A | 3/1998 |
| CN | 101459868 | A | 6/2009 |
| CN | 101489171 | A | 7/2009 |
| CN | 102301747 | A | 12/2011 |
| CN | 105491496 | A | 4/2016 |
| DE | 2044870 | A1 | 3/1972 |
| DE | 3243850 | A1 | 5/1984 |
| DE | 3508830 | A1 | 9/1986 |
| DE | 102013114771 | A1 | 6/2015 |
| EP | 0092822 | A2 | 11/1983 |
| EP | 0242038 | A2 | 10/1987 |
| EP | 0291325 | A2 | 11/1988 |
| EP | 0296092 | A2 | 12/1988 |
| EP | 0242038 | A3 | 5/1989 |
| EP | 0296092 | A3 | 8/1989 |
| EP | 0352954 | A2 | 1/1990 |
| EP | 0291325 | A3 | 6/1990 |
| EP | 0352954 | A3 | 8/1991 |
| EP | 1035753 | A1 | 9/2000 |
| EP | 1435757 | A1 | 7/2004 |
| EP | 1845919 | A1 | 10/2007 |
| EP | 1955407 | A1 | 8/2008 |
| EP | 1845919 | B1 | 9/2010 |
| EP | 2272520 | A1 | 1/2011 |
| EP | 2301262 | A1 | 3/2011 |
| EP | 2752030 | A1 | 7/2014 |
| EP | 3101519 | A1 | 12/2016 |
| EP | 2425502 | B1 | 1/2017 |
| EP | 2907294 | B1 | 5/2017 |
| EP | 3183814 | A1 | 6/2017 |
| EP | 3094067 | B1 | 10/2017 |
| EP | 3006079 | B1 | 3/2019 |
| FR | 2455820 | A1 | 11/1980 |
| GB | 2085694 | A | 4/1982 |
| JP | S60154800 | A | 8/1985 |
| JP | S621726 | B2 | 1/1987 |
| JP | S6443252 | A | 2/1989 |
| JP | H09327098 | A | 12/1997 |
| JP | 2000504913 | A | 4/2000 |
| JP | 2004187953 | A | 7/2004 |
| JP | 2004193908 | A | 7/2004 |
| JP | 2005516505 | A | 6/2005 |
| JP | 2006060833 | A | 3/2006 |
| KR | 100624445 | B1 | 9/2006 |
| WO | WO-9209181 | A1 | 5/1992 |
| WO | WO-9501678 | A1 | 1/1995 |
| WO | WO-9621334 | A1 | 7/1996 |
| WO | WO-9736457 | A1 | 10/1997 |
| WO | WO-9745074 | A1 | 12/1997 |
| WO | WO-9806236 | A1 | 2/1998 |
| WO | WO-9903146 | A1 | 1/1999 |
| WO | WO-9915111 | A1 | 4/1999 |
| WO | WO-0022875 | A2 | 4/2000 |
| WO | WO-0022875 | A3 | 7/2000 |
| WO | WO-0150815 | A1 | 7/2001 |
| WO | WO-0158206 | A2 | 8/2001 |
| WO | WO-0176059 | A2 | 10/2001 |
| WO | WO-0158206 | A3 | 2/2002 |
| WO | WO-0239874 | A2 | 5/2002 |
| WO | WO-0239874 | A3 | 2/2003 |
| WO | WO-03030772 | A2 | 4/2003 |
| WO | WO-03063542 | A2 | 7/2003 |
| WO | WO-03063542 | A3 | 1/2004 |
| WO | WO-2004010733 | A1 | 1/2004 |
| WO | WO-2005015952 | A1 | 2/2005 |
| WO | WO-2005107320 | A1 | 11/2005 |
| WO | WO-2006014915 | A2 | 2/2006 |
| WO | WO-2006037156 | A1 | 4/2006 |
| WO | WO-2006039146 | A2 | 4/2006 |
| WO | WO-2006042298 | A2 | 4/2006 |
| WO | WO-2006071210 | A1 | 7/2006 |
| WO | WO-2006075169 | A1 | 7/2006 |
| WO | WO-2006075175 | A1 | 7/2006 |
| WO | WO-2006118819 | A2 | 11/2006 |
| WO | WO-2006042298 | A3 | 12/2006 |
| WO | WO-2007023164 | A1 | 3/2007 |
| WO | WO-2009046329 | A1 | 4/2009 |
| WO | WO-2009047370 | A2 | 4/2009 |
| WO | WO-2009049320 | A1 | 4/2009 |
| WO | WO-2009056167 | A1 | 5/2009 |
| WO | WO-2009062142 | A1 | 5/2009 |
| WO | WO-2009047370 | A3 | 7/2009 |
| WO | WO-2009125903 | A1 | 10/2009 |
| WO | WO-2009145842 | A2 | 12/2009 |
| WO | WO-2009146151 | A2 | 12/2009 |
| WO | WO-2009155358 | A1 | 12/2009 |
| WO | WO-2009155361 | A1 | 12/2009 |
| WO | WO-2009155385 | A1 | 12/2009 |
| WO | WO-2010033932 | A1 | 3/2010 |
| WO | WO-2010033933 | A1 | 3/2010 |
| WO | WO-2010077781 | A2 | 7/2010 |
| WO | WO-2010147935 | A1 | 12/2010 |
| WO | WO-2010148345 | A2 | 12/2010 |
| WO | WO-2011005500 | A2 | 1/2011 |
| WO | WO-2012088187 | A2 | 6/2012 |
| WO | WO-2012149970 | A1 | 11/2012 |
| WO | WO-2013016336 | A2 | 1/2013 |

(56) References Cited

FOREIGN PATENT DOCUMENTS

| WO | WO-2016011044 A1 | 1/2016 |
|---|---|---|
| WO | WO-2016045709 A1 | 3/2016 |
| WO | WO-2016146487 A1 | 9/2016 |
| WO | WO-2017045700 A1 | 3/2017 |
| WO | WO-2017059218 A1 | 4/2017 |
| WO | WO-2017059240 A1 | 4/2017 |
| WO | WO-2017116791 A1 | 7/2017 |
| WO | WO-2017116865 A1 | 7/2017 |
| WO | WO-2018048794 A1 | 3/2018 |
| WO | WO-2018081121 A1 | 5/2018 |
| WO | WO-2018093733 A1 | 5/2018 |
| WO | WO-2019055308 A1 | 3/2019 |
| WO | WO-2019173470 A1 | 9/2019 |
| WO | WO-2019199680 A1 | 10/2019 |
| WO | WO-2019199683 A1 | 10/2019 |
| WO | WO-2020176086 A1 | 9/2020 |
| WO | WO-2021003087 A1 | 1/2021 |

OTHER PUBLICATIONS

Notice of Allowance dated Sep. 10, 2021 for U.S. Appl. No. 17/066,341.

Notice of Allowance dated Nov. 23, 2021 for U.S. Appl. No. 17/066,341.

Asbeck, et al. Scaling Hard Vertical Surfaces with Compliant Microspine Arrays, The International Journal of Robotics Research 2006; 25; 1165-79.

Atasoy [Paper] Opto-acoustic Imaging, for BYM504E Biomedical Imaging Systems class at ITU, downloaded from the Internet www2.itu.edu.td—cilesiz/courses/BYM504- 2005-OA 504041413. pdf, 14 pages.

Athanassiou, et al. Laser controlled photomechanical actuation of photochromic polymers Microsystems. Rev. Adv. Mater. Sci. 2003; 5:245-251.

Autumn, et al. Dynamics of geckos running vertically, The Journal of Experimental Biology 209, 260-272, (2006).

Autumn, et al., Evidence for van der Waals adhesion in gecko setae, www.pnas.orgycgiydoiy10.1073ypnas.192252799 (2002).

Ayatollahi, et al. Design and Modeling of Micromachined Condenser MEMS Loudspeaker using Permanent Magnet Neodymium-Iron-Boron (Nd—Fe—B). IEEE International Conference on Semiconductor Electronics, 2006. ICSE '06, Oct. 29 2006-Dec. 1, 2006; 160-166.

Baer, et al. Effects of Low Pass Filtering on the Intelligibility of Speech in Noise for People With and Without Dead Regions at High Frequencies. J. Acost. Soc. Am 112 (3), pt. 1, (Sep. 2002), pp. 1133-1144.

Best, et al. The influence of high frequencies on speech localization. Abstract 981 (Feb. 24, 2003) from www.aro.org/abstracts/abstracts.html.

Birch, et al. Microengineered systems for the hearing impaired. IEE Colloquium on Medical Applications of Microengineering, Jan. 31, 1996; p. 2/1-2/5.

Boedts. Tympanic epithelial migration, Clinical Otolaryngology 1978, 3, 249-253.

Burkhard, et al. Anthropometric Manikin for Acoustic Research. J. Acoust. Soc. Am., vol. 58, No. 1, (Jul. 1975), pp. 214-222.

Camacho-Lopez, et al. Fast Liquid Crystal Elastomer Swims Into the Dark, Electronic Liquid Crystal Communications. Nov. 26, 2003; 9 pages total.

Carlile, et al. Frequency bandwidth and multi-talker environments. Audio Engineering Society Convention 120. Audio Engineering Society, May 20-23, 2006. Paris, France. 118: 8 pages.

Carlile, et al. Spatialisation of talkers and the segregation of concurrent speech. Abstract 1264 (Feb. 24, 2004) from www.aro.org/abstracts/abstracts.html.

Cheng, et al. A Silicon Microspeaker for Hearing Instruments. Journal of Micromechanics and Microengineering 2004; 14(7):859-866.

Co-pending U.S. Appl. No. 17/356,217, inventors Imatani; Kyle et al., filed Jun. 23, 2021.

Dictionary.com's (via American Heritage Medical Dictionary) online dictionary definition of 'percutaneous'. Accessed on Jun. 3, 2013. 2 pages.

Merriam-Webster's online dictionary definition of 'percutaneous'. Accessed on Jun. 3, 2013. 3 pages.

Datskos, et al. Photoinduced and thermal stress in silicon microcantilevers. Applied Physics Letters. Oct. 19, 1998; 73(16):2319-2321.

Decraemer, et al. A method for determining three-dimensional vibration in the ear. Hearing Res., 77:19-37 (1994).

Dundas et al. The Earlens Light-Driven Hearing Aid: Top 10 questions and answers. Hearing Review. 2018;25(2):36-39.

Ear. Downloaded from the Internet. Accessed Jun. 17, 2008. 4 pages. URL: http://wwwmgs.bionet.nsc.ru/mgs/gnw/trrd/thesaurus/Se/ear.html.

Edinger, J.R. High-Quality Audio Amplifier With Automatic Bias Control. Audio Engineering; Jun. 1947; pp. 7-9.

Fay. Cat eardrum mechanics. Ph.D. thesis. Dissertation submitted to Department of Aeronautics and Astronautics. Stanford University. May 2001; 210 pages total.

Fay, et al. Cat eardrum response mechanics. Mechanics and Computation Division. Department of Mechanical Engineering. Stanford University. 2002; 10 pages total.

Fay, et al. Preliminary evaluation of a light-based contact hearing device for the hearing impaired. Otol Neurotol. Jul. 2013;34(5):912-21. doi: 10.1097/MAO.0b013e31827de4b1.

Fay, et al. The discordant eardrum, PNAS, Dec. 26, 2006, vol. 103, No. 52, p. 19743-19748.

Fletcher. Effects of Distortion on the Individual Speech Sounds. Chapter 18, ASA Edition of Speech and Hearing in Communication, Acoust Soc.of Am. (republished in 1995) pp. 415-423.

Folkeard, et al. Detection, Speech Recognition, Loudness, and Preference Outcomes With a Direct Drive Hearing Aid: Effects of Bandwidth. Trends Hear. Jan-Dec. 2021; 25: 1-17. doi: 10.1177/2331216521999139.

Freyman, et al. Spatial Release from Informational Masking in Speech Recognition. J. Acost. Soc. Am., vol. 109, No. 5, pt. 1, (May 2001); 2112-2122.

Freyman, et al. The Role of Perceived Spatial Separation in the Unmasking of Speech. J. Acoust. Soc. Am., vol. 106, No. 6, (Dec. 1999); 3578-3588.

Fritsch, et al. EarLens transducer behavior in high-field strength MRI scanners. Otolaryngol Head Neck Surg. Mar. 2009;140(3):426-8. doi: 10.1016/j.otohns.2008.10.016.

Galbraith et al. A wide-band efficient inductive transdermal power and data link with coupling insensitive gain IEEE Trans Biomed Eng. Apr. 1987;34(4):265-75.

Gantz, et al. Broad Spectrum Amplification with a Light Driven Hearing System. Combined Otolaryngology Spring Meetings, 2016 (Chicago).

Gantz, et al. Light Driven Hearing System: A Multi-Center Clinical Study. Association for Research in Otolaryngology Annual Meeting, 2016 (San Diego).

Gantz, et al. Light-Driven Contact Hearing Aid for Broad Spectrum Amplification: Safety and Effectiveness Pivotal Study. Otology & Neurotology Journal, 2016 (in review).

Gantz, et al. Light-Driven Contact Hearing Aid for Broad-Spectrum Amplification: Safety and Effectiveness Pivotal Study. Otology & Neurotology. Copyright 2016. 7 pages.

Ge, et al., Carbon nanotube-based synthetic gecko tapes, p. 10792-10795, PNAS, Jun. 26, 2007, vol. 104, No. 26.

Gennum. GA3280 Preliminary Data Sheet: Voyageur TD Open Platform DSP System for Ultra Low Power Audio Processing. Oct. 2006; 17 pages. Downloaded from the Internet: www.sounddesigntechnologies.com/products/pdf/37601DOC.pdf.

Gobin, et al. Comments on the physical basis of the active materials concept. Proc. SPIE 2003;4512:84-92.

Gorb, et al. Structural Design and Biomechanics of Friction-Based Releasable Attachment Devices in Insects. Integr Comp Biol. Dec. 2002. 42(6):1127-1139. doi: 10.1093/icb/42.6.1127.

(56) References Cited

OTHER PUBLICATIONS

Hakansson, et al. Percutaneous vs. transcutaneous transducers for hearing by direct bone conduction (Abstract). Otolaryngol Head Neck Surg. Apr. 1990;102(4):339-44.
Hato, et al. Three-dimensional stapes footplate motion in human temporal bones. Audiol. Neurootol., 8:140-152 (Jan. 30, 2003).
Hofman, et al. Relearning Sound Localization With New Ears. Nature Neuroscience, vol. 1, No. 5, (Sep. 1998); 417-421.
Izzo, et al. Laser Stimulation of Auditory Neurons: Effect of Shorter Pulse Duration and Penetration Depth. Biophys J. Apr. 15, 2008;94(8):3159-3166.
Izzo, et al. Laser Stimulation of the Auditory Nerve. Lasers Surg Med. Sep. 2006;38(8):745-753.
Izzo, et al. Selectivity of Neural Stimulation In the Auditory System: A Comparison of Optic and Electric Stimuli. J Biomed Opt. Mar.-Apr. 2007;12(2):021008.
Jackson, et al. Multiphoton and Transmission Electron Microscopy of Collagen in Ex Vivo Tympanic Membranes. Ninth Annual Symposium on Biomedical Computation at Stanford (BCATS). BCATS 2008 Abstract Book. Poster 18:56. Oct. 2008. URL: www.stanford.edu/~puria1/BCATS08.html.
Jian, et al. A 0.6 V, 1.66 mW energy harvester and audio driver for tympanic membrane transducer with wirelessly optical signal and power transfer. InCircuits and Systems (ISCAS), 2014 IEEE International Symposium on Jun. 1, 2014. 874-7. IEEE.
Jin, et al. Speech Localization. J. Audio Eng. Soc. convention paper, presented at the AES 112th Convention, Munich, Germany, May 10-13, 2002, 13 pages total.
Khaleghi, et al. Attenuating the ear canal feedback pressure of a laser-driven hearing aid. J Acoust Soc Am. Mar. 2017;141(3):1683.
Khaleghi, et al. Attenuating the feedback pressure of a light-activated hearing device to allows microphone placement at the ear canal entrance. IHCON 2016, International Hearing Aid Research Conference, Tahoe City, CA, Aug. 2016.
Khaleghi, et al. Characterization of Ear-Canal Feedback Pressure due to Umbo-Drive Forces: Finite-Element vs. Circuit Models. ARO Midwinter Meeting 2016, (San Diego).
Khaleghi, et al. Mechano-Electro-Magnetic Finite Element Model of a Balanced Armature Transducer for a Contact Hearing Aid. Proc. MoH 2017, Mechanics of Hearing workshop, Brock University, Jun. 2017.
Khaleghi, et al. Multiphysics Finite Element Model of a Balanced Armature Transducer used in a Contact Hearing Device. ARO 2017, 40th ARO MidWinter Meeting, Baltimore, MD, Feb. 2017.
Kiessling, et al. Occlusion Effect of Earmolds with Different Venting Systems. J Am Acad Audiol. Apr. 2005;16(4):237-49.
Killion, et al. The case of the missing dots: AI and SNR loss. The Hearing Journal, 1998. 51(5), 32-47.
Killon. Myths About Hearing in Noise and Directional Microphones. The Hearing Review. Feb. 2004; 11(2):14, 16, 18, 19, 72 & 73.
Killion. SNR loss: I can hear what people say but I can't understand them. The Hearing Review, 1997; 4(12):8-14.
Knight, D. Diode detectors for RF measurement. Paper. Jan. 1, 2016. [Retrieved from 1-16 online] (retrieved Feb. 11, 2020) abstract, p. 1; section 1, p. 6; section 1.3, p. 9; section 3 voltage-double rectifier, p. 21; section 5, p. 27. URL: g3ynh.info/circuits/Diode_det.pdf.
Lee, et al. A Novel Opto-Electromagnetic Actuator Coupled to the tympanic Membrane. J Biomech. Dec. 5, 2008;41 (16):3515-8. Epub Nov. 7, 2008.
Lee, et al. The optimal magnetic force for a novel actuator coupled to the tympanic membrane: a finite element analysis. Biomedical engineering: applications, basis and communications. 2007; 19(3):171-177.
Levy, et al. Characterization of the available feedback gain margin at two device microphone locations, in the fossa triangularis and Behind the Ear, for the light-based contact hearing device. Acoustical Society of America (ASA) meeting, 2013 (San Francisco).
Levy, et al. Extended High-Frequency Bandwidth Improves Speech Reception in the Presence of Spatially Separated Masking Speech. Ear Hear. Sep. 2015-Oct. 36(5):e214-24. doi: 10.1097/AUD.0000000000000161.
Levy et al. Light-driven contact hearing aid: a removable direct-drive hearing device option for mild to severe sensorineural hearing impairment. Conference on Implantable Auditory Prostheses, Tahoe City, CA, Jul. 2017. 4 pages.
Lezal. Chalcogenide glasses—survey and progress. Journal of Optoelectronics and Advanced Materials. Mar. 2003; 5(1):23-34.
Mah. Fundamentals of photovoltaic materials. National Solar Power Research Institute. Dec. 21, 1998, 3-9.
Makino, et al. Epithelial migration in the healing process of tympanic membrane perforations. Eur Arch Otorhinolaryngol. 1990; 247: 352-355.
Makino, et al., Epithelial migration on the tympanic membrane and external canal, Arch Otorhinolaryngol (1986) 243:39-42.
Markoff. Intuition + Money: An Aha Moment. New York Times Oct. 11, 2008, page BU4, 3 pages total.
Martin, et al. Utility of Monaural Spectral Cues is Enhanced in the Presence of Cues to Sound-Source Lateral Angle. JARO. 2004; 5:80-89.
McElveen et al. Overcoming High-Frequency Limitations of Air Conduction Hearing Devices Using a Light-Driven Contact Hearing Aid. Poster presentation at The Triological Society, 120th Annual Meeting at COSM, Apr. 28, 2017; San Diego, CA.
Michaels, et al., Auditory epithelial migration on the human tympanic membrane: II. The existence of two discrete migratory pathways and their embryologic correlates. Am J Anat. Nov. 1990. 189(3):189-200. DOI: 10.1002/aja.1001890302.
Moore, et al. Perceived naturalness of spectrally distorted speech and music. J Acoust Soc Am. Jul. 2003;114(1):408-19.
Moore, et al. Spectro-temporal characteristics of speech at high frequencies, and the potential for restoration of audibility to people with mild-to-moderate hearing loss. Ear Hear. Dec. 2008;29(6):907-22. doi: 10.1097/AUD.0b013e31818246f6.
Moore. Loudness perception and intensity resolution. Cochlear Hearing Loss, Chapter 4, pp. 90-115, Whurr Publishers Ltd., London (1998).
Murphy, et al. Adhesion and anisotropic friction enhancements of angled heterogeneous micro-fiber arrays with spherical and spatula tips. Journal of Adhesion Science and Technology. vol. 21. No. 12-13. Aug. 2007. pp. 1281-1296. DOI: 10.1163/156856107782328380.
Murugasu, et al. Malleus-to-footplate versus malleus-to-stapes-head ossicular reconstruction prostheses: temporal bone pressure gain measurements and clinical audiological data. Otol Neurotol. Jul. 2005;26(4):572-82. DOI: 10.1097/01.mao.0000178151.44505.1b.
Musicant, et al. Direction-dependent spectral properties of cat external ear: new data and cross-species comparisons. J Acoust Soc Am. Feb. 1990. 87(2):757-781. DOI: 10.1121/1.399545.
National Semiconductor. LM4673 Boomer: Filterless, 2.65W, Mono, Class D Audio Power Amplifier. Nov. 1, 2007. 24 pages. [Data Sheet] downloaded from the Internet: URL: www.national.com/ds/LM/LM4673.pdf.
Nishihara, et al. Effect of changes in mass on middle ear function. Otolaryngol Head Neck Surg. Nov. 1993;109(5):889-910.
O'Connor, et al. Middle ear Cavity and Ear Canal Pressure-Driven Stapes Velocity Responses in Human Cadaveric Temporal Bones. J Acoust Soc Am. Sep. 2006;120(3):1517-28.
Park, et al. Design and analysis of a microelectromagnetic vibration transducer used as an implantable middle ear hearing aid. J. Micromech. Microeng. Vol. 12 (2002), pp. 505-511.
PCT/US2019/026352 International Search Report and Written Opinion dated Jul. 2, 2019.
Perkins, et al. Light-based Contact Hearing Device: Characterization of available Feedback Gain Margin at two device microphone locations. Presented at AAO-HNSF Annual Meeting, 2013 (Vancouver).
Perkins, et al. The EarLens Photonic Transducer: Extended bandwidth. Presented at AAO-HNSF Annual Meeting, 2011 (San Francisco).
Perkins, et al. The EarLens System: New sound transduction methods. Hear Res. Feb. 2, 2010; 10 pages total.

(56) References Cited

OTHER PUBLICATIONS

Perkins, R. Earlens tympanic contact transducer: a new method of sound transduction to the human ear. Otolaryngol Head Neck Surg. Jun. 1996;114(6):720-8.

Poosanaas, et al. Influence of sample thickness on the performance of photostrictive ceramics, J. App. Phys. Aug. 1, 1998; 84(3):1508-1512.

Puria et al. A gear in the middle ear. ARO Denver Co, 2007b.

Puria, et al. Cues above 4 kilohertz can improve spatially separated speech recognition. The Journal of the Acoustical Society of America, 2011, 129, 2384.

Puria, et al. Extending bandwidth above 4 kHz improves speech understanding in the presence of masking speech. Association for Research in Otolaryngology Annual Meeting, 2012 (San Diego).

Puria, et al. Extending bandwidth provides the brain what it needs to improve hearing in noise. First international conference on cognitive hearing science for communication, 2011 (Linkoping, Sweden).

Puria, et al. Hearing Restoration: Improved Multi-talker Speech Understanding. 5th International Symposium on Middle Ear Mechanics In Research and Otology (MEMRO), Jun. 2009 (Stanford University).

Puria, et al. Imaging, Physiology and Biomechanics of the middle ear: Towards understating the functional consequences of anatomy. Stanford Mechanics and Computation Symposium, 2005, ed Fong J.

Puria, et al. Malleus-to-footplate ossicular reconstruction prosthesis positioning: cochleovestibular pressure optimization. Otol Nerotol. May 2005; 26(3):368-379. DOI: 10.1097/01.mao.0000169788.07460.4a.

Puria, et al. Measurements and model of the cat middle ear: Evidence of tympanic membrane acoustic delay. J. Acoust. Soc. Am., 104(6):3463-3481 (Dec. 1998).

Puria, et al., Mechano-Acoustical Transformations in A. Basbaum et al., eds., The Senses: A Comprehensive Reference, v3, p. 165-201, Academic Press (2008).

Puria, et al. Middle Ear Morphometry From Cadaveric Temporal Bone MicroCT Imaging. Proceedings of the 4th International Symposium, Zurich, Switzerland, Jul. 27-30, 2006, Middle Ear Mechanics In Research And Otology, pp. 260-269.

Puria, et al. Sound-Pressure Measurements In The Cochlear Vestibule Of Human-Cadaver Ears. Journal of the Acoustical Society of America. 1997; 101 (5-1): 2754-2770.

Puria, et al. Temporal-Bone Measurements of the Maximum Equivalent Pressure Output and Maximum Stable Gain of a Light-Driven Hearing System That Mechanically Stimulates the Umbo. Otol Neurotol. Feb. 2016;37(2):160-6. doi: 10.1097/MAO.0000000000000941.

Puria, et al. The EarLens Photonic Hearing Aid. Association for Research in Otolaryngology Annual Meeting, 2012 (San Diego).

Puria, et al. The Effects of bandwidth and microphone location on understanding of masked speech by normal-hearing and hearing-impaired listeners. International Conference for Hearing Aid Research (IHCON) meeting, 2012 (Tahoe City).

Puria, et al. Tympanic-membrane and malleus-incus-complex co-adaptations for high-frequency hearing in mammals. Hear Res. May 2010;263(1-2):183-90. doi: 10.1016/j.heares.2009.10.013. Epub Oct. 28, 2009.

Puria. Measurements of human middle ear forward and reverse acoustics: implications for otoacoustic emissions. J Acoust Soc Am. May 2003;113(5):2773-89.

Puria, S. Middle Ear Hearing Devices. Chapter 10. Part of the series Springer Handbook of Auditory Research pp. 273-308. Date: Feb. 9, 2013.

Qu, et al. Carbon nanotube arrays with strong shear binding-on and easy normal lifting-off. Science. Oct. 10, 2008. 322(5899):238-342. doi: 10.1126/science.1159503.

Robles, et al. Mechanics of the mammalian cochlea. Physiol Rev. Jul. 2001;81(3):1305-52.

Roush. SiOnyx Brings "Black Silicon" into the Light; Material Could Upend Solar, Imaging Industries. Xconomy, Oct. 12, 2008, retrieved from the Internet: www.xconomy.com/boston/2008/10/12/sionyx-brings-black-silicon-into-the-light¬,material-could-upend-solar-imaging-industries 4 pages total.

Rubinstein. How cochlear implants encode speech. Curr Opin Otolaryngol Head Neck Surg. Oct. 2004. 12(5):444-448. DOI: 10.1097/01.moo.0000134452.24819.c0.

School of Physics Sydney, Australia. Acoustic Compliance, Inertance and Impedance. 1-6. (2018). http://www.animations.physics.unsw.edu.au/jw/compliance-inertance-impedance.htm.

Sekaric, et al. Nanomechanical resonant structures as tunable passive modulators. Applied Physics Letters. May 2002. 80(19):3617-3619. DOI: 10.1063/1.1479209.

Shaw. Transformation of Sound Pressure Level From the Free Field to the Eardrum in the Horizontal Plane. J. Acoust. Soc. Am., vol. 56, No. 6, (Dec. 1974), 1848-1861.

Shih, et al. Shape and displacement control of beams with various boundary conditions via photostrictive optical actuators. Proc. IMECE. Nov. 2003; 1-10.

Smith. The Scientist and Engineers Guide to Digital Signal Processing. California Technical Publishing. 1997. Chapter 22. pp. 351-372.

Song, et al. The development of a non-surgical direct drive hearing device with a wireless actuator coupled to the tympanic membrane. Applied Acoustics. Dec. 31, 2013;74(12):1511-8.

Sound Design Technologies. Voyager TD Open Platform DSP System for Ultra Low Power Audio Processing—GA3280 Data Sheet. Oct. 2007. 15 pages. Retrieved from the Internet: www.sounddes.com/pdf/37601DOC.pdf.

Spolenak, et al. Effects of contact shape on the scaling of biological attachments. Proc. R. Soc. A. 2005;461:305-319.

Stenfelt, et al. Bone-Conducted Sound: Physiological and Clinical Aspects. Otology & Neurotology, Nov. 2005; 26 (6):1245-1261.

Struck, et al. Comparison of Real-world Bandwidth in Hearing Aids vs Earlens Light-driven Hearing Aid System. The Hearing Review. TechTopic: EarLens. Hearingreview.com. Mar. 14, 2017. pp. 24-28.

Stuchlik, et al. Micro-Nano Actuators Driven by Polarized Light. IEEE Proc. Sci. Meas. Techn. Mar. 2004; 151(2):131-136.

Suski, et al. Optically activated ZnO/SiO2/Si cantilever beams. Sensors and Actuators A: Physical. Sep. 1990. 24(3): 221-225. https://doi.org/10.1016/0924-4247(90)80062-A.

Takagi, et al. Mechanochemical Synthesis of Piezoelectric PLZT Powder. KONA. 2003; 51(21):234-241.

Thakoor, et al. Optical microactuation in piezoceramics. Proc. SPIE. Jul. 1998; 3328:376-391.

Thompson. Tutorial on microphone technologies for directional hearing aids. Hearing Journal. Nov. 2003; 56(11):14-16, 18, 20-21.

Tzou, et al. Smart Materials, Precision Sensors/Actuators, Smart Structures, and Structronic Systems. Mechanics of Advanced Materials and Structures. 2004; 11:367-393.

Uchino, et al. Photostricitve actuators. Ferroelectrics. 2001; 258:147-158.

Vickers, et al. Effects of Low-Pass Filtering on the Intelligibility of Speech in Quiet for People With and Without Dead Regions at High Frequencies. J. Acoust. Soc. Am. Aug. 2001; 110(2):1164-1175.

Vinge. Wireless Energy Transfer by Resonant Inductive Coupling. Master of Science Thesis. Chalmers University of Technology. 1-83 (2015).

Vinikman-Pinhasi, et al. Piezoelectric and Piezooptic Effects in Porous Silicon. Applied Physics Letters, Mar. 2006; 88(11): 111905-1-111905-2. DOI: 10.1063/1.2186395.

Wang, et al. Preliminary Assessment of Remote Photoelectric Excitation of an Actuator for a Hearing Implant. Proceeding of the 2005 IEEE, Engineering in Medicine and Biology 27th Annual Conference, Shanghai, China. Sep. 1-4, 2005; 6233-6234.

Web Books Publishing, "The Ear," accessed online Jan. 22, 2013, available online Nov. 2, 2007 at http://www.web-books.com/eLibrary/Medicine/Physiology/Ear/Ear.htm.

Wiener, et al. On the Sound Pressure Transformation By the Head and Auditory Meatus of the Cat. Acta Otolaryngol. Mar. 1966; 61(3):255-269.

(56) References Cited

OTHER PUBLICATIONS

Wightman, et al. Monaural Sound Localization Revisited. J Acoust Soc Am. Feb. 1997;101(2):1050-1063.
Wiki. Sliding Bias Variant 1, Dynamic Hearing (2015).
Wikipedia. Headphones. Downloaded from the Internet. Accessed Oct. 27, 2008. 7 pages. URL: http://en.wikipedia.org/wiki/Headphones.
Wikipedia. Inductive Coupling. 1-2 (Jan. 11, 2018). https://en.wikipedia.org/wiki/Inductive_coupling.
Wikipedia. Pulse-density Coupling. 1-4 (Apr. 6, 2017). https://en.wikipedia.org/wiki/Pulse-density_modulation.
Wikipedia. Resonant Inductive Coupling. 1-11 (Jan. 12, 2018). https://en.wikipedia.org/wiki/Resonant_inductive_coupling#cite_note-13.
Yao, et al. Adhesion and sliding response of a biologically inspired fibrillar surface: experimental observations, J. R. Soc. Interface (2008) 5, 723-733 doi:10.1098/rsif.2007.1225 Published online Oct. 30, 2007.
Yao, et al. Maximum strength for intermolecular adhesion of nanospheres at an optimal size. J R Soc Interface. Nov. 6, 2008;5(28):1363-70. doi: 10.1098/rsif.2008.0066.
Yi, et al. Piezoelectric Microspeaker with Compressive Nitride Diaphragm. The Fifteenth IEEE International Conference on Micro Electro Mechanical Systems, 2002; 260-263.
Yu, et al. Photomechanics: Directed bending of a polymer film by light. Nature. Sep. 11, 2003;425(6954):145. DOI: 10.1038/425145a.

\* cited by examiner

DYNAMIC FILTER

CROSS-REFERENCE

This application is a continuation of U.S. patent application Ser. No. 17/066,341, filed Oct. 8, 2020, now U.S. Pat. No. 11,212,626; which is a continuation of PCT Application No. PCT/US19/26352, filed Apr. 8, 2019; which claims the benefit of U.S. Provisional Application No. 62/655,155, filed Apr. 9, 2018; the entire contents of which are herein incorporated by reference.

BACKGROUND OF THE INVENTION

In contact hearing systems (e.g., light-driven or inductively-coupled), such as those available from Earlens Corporation, dynamic frequency-dependent gain in the signal processing system may be implemented by a finite impulse response ("FIR") filter with coefficients that change over time. Changes in coefficients can introduce brief audible artifacts in the device output. In prior devices, audible artifacts due to filter changes were reduced by slowing and smoothing those changes.

SUMMARY

Aspects of the current invention are intended to render artifacts, which are introduced by changes in coefficients in an FIR filter, inaudible by applying a window to the filtered signal that results in the output of the filter (e.g., FIR filter), in which the coefficients are being changed, supplying little or none of the total output while the output of the window, in which the coefficients are stable, supplies most or all of the total output.

One method of reducing or eliminating audible artifacts may include individually interpolating each filter coefficient by a weighting equivalent to the window values described with respect to the present invention. However, since the interpolation would need to be applied to all coefficients at every output sample, use of the windowing method according to the present invention, as described herein, would be a much more efficient way of preventing audible artifacts resulting from the change in coefficients.

BRIEF DESCRIPTION OF THE DRAWINGS

The foregoing and other objects, features and advantages of embodiments of the present inventive concepts will be apparent from the more particular description of preferred embodiments, as illustrated in the accompanying drawings in which like reference characters refer to the same or like elements. The drawings are not necessarily to scale, emphasis instead being placed upon illustrating the principles of the preferred embodiments.

DETAILED DESCRIPTION OF THE INVENTION

Figure 1:
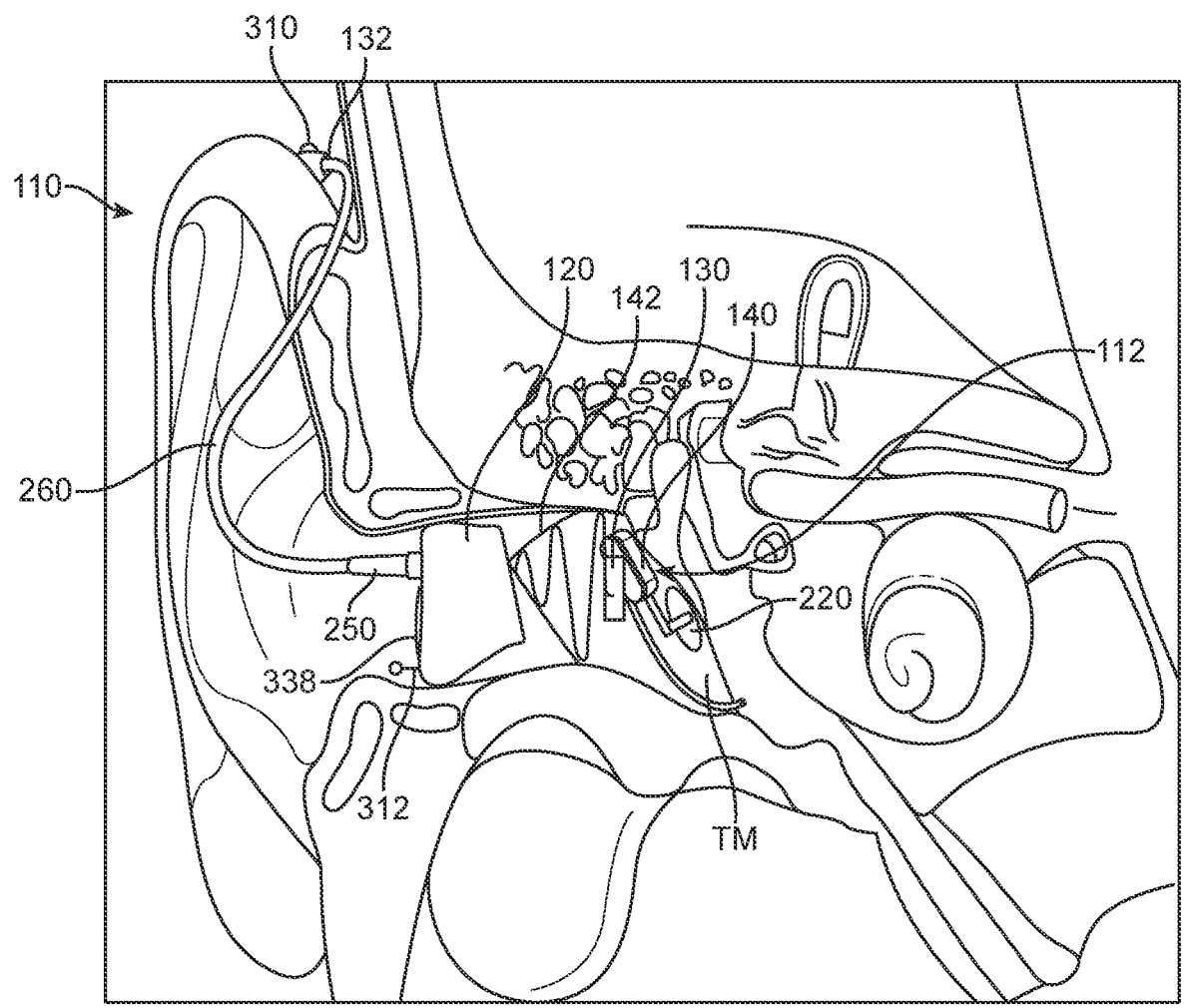
FIG. 1 is a cutaway view of an ear canal showing a light-coupled contact hearing system for use in the present invention, wherein at least a portion of the contact hearing system is positioned in the ear canal.

FIG. 1 is a cutaway view of an ear canal showing a light-coupled contact hearing system for use in the present invention, wherein at least a portion of the contact hearing system is positioned in the ear canal. FIG. 1 is a cutaway view of an ear canal showing a contact hearing system 110 for use in the present invention, wherein the contact hearing system 110 is positioned in the ear canal. In embodiments of the invention, contact hearing system 110 may comprise a contact hearing system using light to transmit information and/or power from the ear tip to the contact hearing device. In FIG. 1, contact hearing system 110 includes audio processor 132, which audio processor may include at least one external microphone 310. Audio processor 132 may be connected to an ear tip 120 by cable 260, which is adapted to transmit signals from audio processor 132 to ear tip 120. Taper tube 250 may be used to support cable 260 at ear tip 120. Ear tip 120 may further include canal microphone 312 and acoustic vent 338. Ear tip 120 may be a light tip which radiates light pulses 142 in response to signals from audio processor 132. Light or other signals radiated by ear tip 120 may be received by contact hearing device 112, which may comprise photodetector 130, microactuator 140, and umbo lens 220. Contact hearing device 112 may be positioned on tympanic membrane TM.

Figure 2:
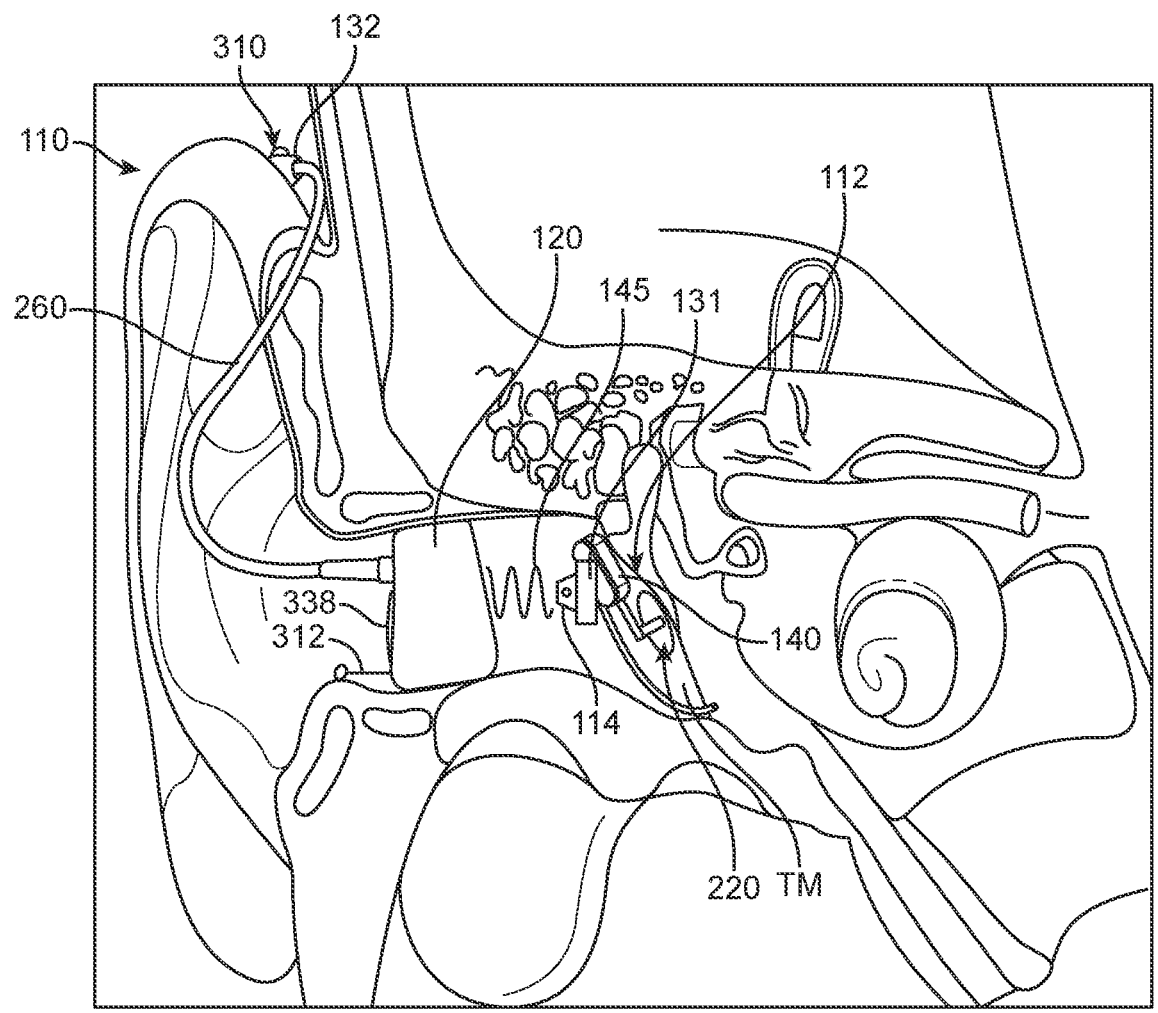
FIG. 2 is a cutaway view of an ear canal showing an inductively coupled contact hearing system according to the present invention, wherein at least a portion of the contact hearing system is positioned in the ear canal.

FIG. 2 is a cutaway view of an ear canal showing a contact hearing system 110 for use in systems and methods according to the present invention, wherein at least a portion of the contact hearing system 110 is positioned in the ear canal. In embodiments of the invention, contact hearing system 110 may comprise a contact hearing system using electromagnetic waves 145 to transmit information and/or power from ear tip 120 to the contact hearing device 112. In embodiments of the invention, contact hearing system 110 may comprise a contact hearing system using inductive coupling to transmit information and/or power from ear tip 120 to contact hearing device 112. In FIG. 2, contact hearing system 110 may include audio processor 132, which audio processor may include at least one external microphone 310. Audio processor 132 may be connected to an ear tip 120 by cable 260, which is adapted to transmit signals from audio processor 132 to ear tip 120. Ear tip 120 may further include canal microphone 312 and at least one acoustic vent 338. Ear tip 120 may be an ear tip which radiates electromagnetic waves 145 in response to signals from audio processor 132. Electromagnetic signals radiated by ear tip 120 may be received by contact hearing device 112, which may comprise receive coil 131, microactuator 140, and umbo lens 220. Contact hearing device 112 may further include grasping tab 114.

Figure 3:
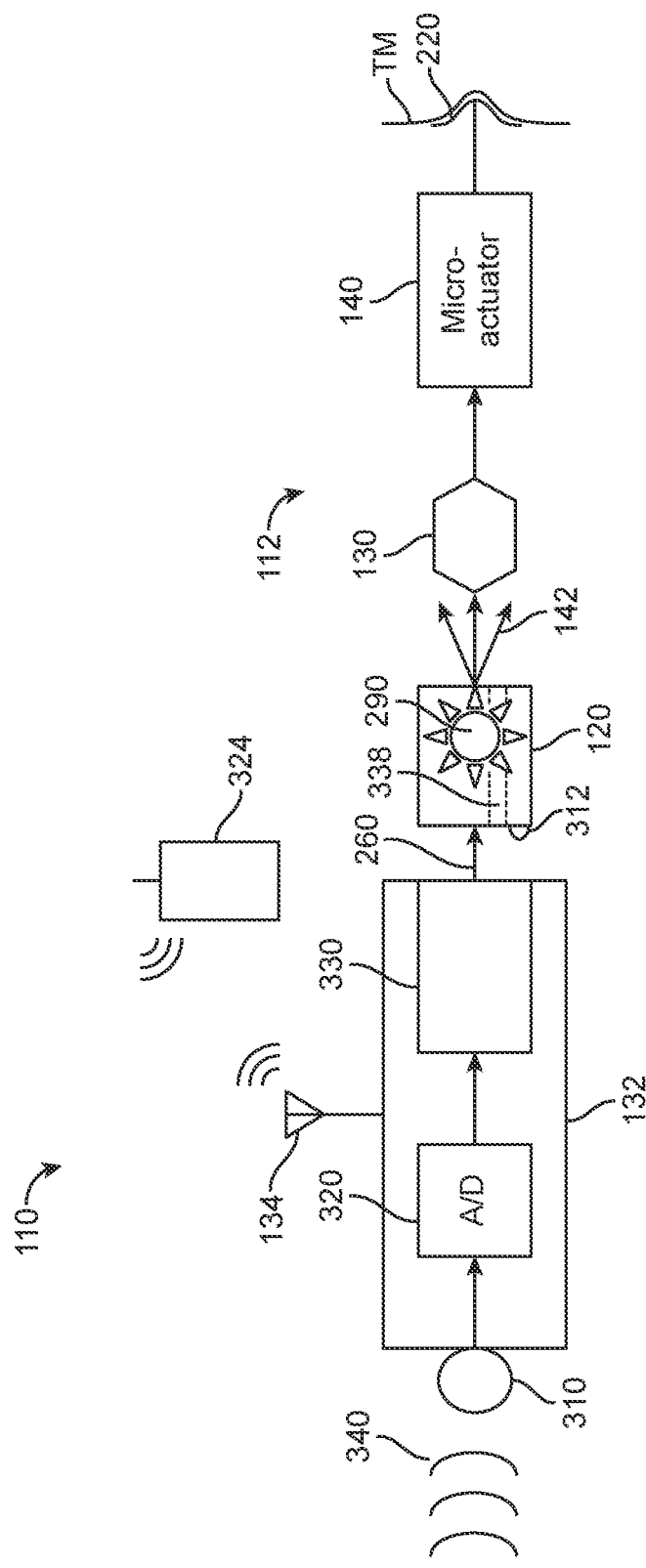
FIG. 3 is a block diagram of a light-coupled contact hearing system for use in the present invention.

FIG. 3 is a block diagram of a light-coupled contact hearing system for use in the present invention, wherein the contact hearing system 110 may be positioned in the ear canal of a user. In embodiments of the invention, contact hearing system 110 may include one or more external communication and control devices 324, which may also act as a data transmission device 400 (as in FIG. 6). In embodiments of the invention, audio processor 132 may communicate with external communication and control devices 324 by, for example, using audio processor antenna 134. In FIG. 3, contact hearing system 110 may include audio processor 132, ear tip 120, and contact hearing device 112. Audio processor 132 may include external microphone 310, audio processor antenna 134, analog to digital converter 320, and signal processor 330. Audio processor 132 may be connected to ear tip 120 by cable 260. Ear tip 120, which may also be referred to as a light tip, may include a light source 290 (which may be a laser), acoustic vent 338, and canal microphone 312. Signals, including data and power, may be transmitted from ear tip 120 to contact hearing device 112 using light, such as light pulses 142. Contact hearing device 112 may include photodetector 130, microactuator 140, and umbo lens 220. Umbo lens 220 may be positioned to contact tympanic membrane TM. In FIG. 3, acoustic input 340 (which may be an ambient sound or an audible sound) may be received by external microphone 310 of audio processor 132, which then processes the received sound by passing it through processing circuitry, which may include analog to digital converter 320 and signal processor 330.

Figure 4:
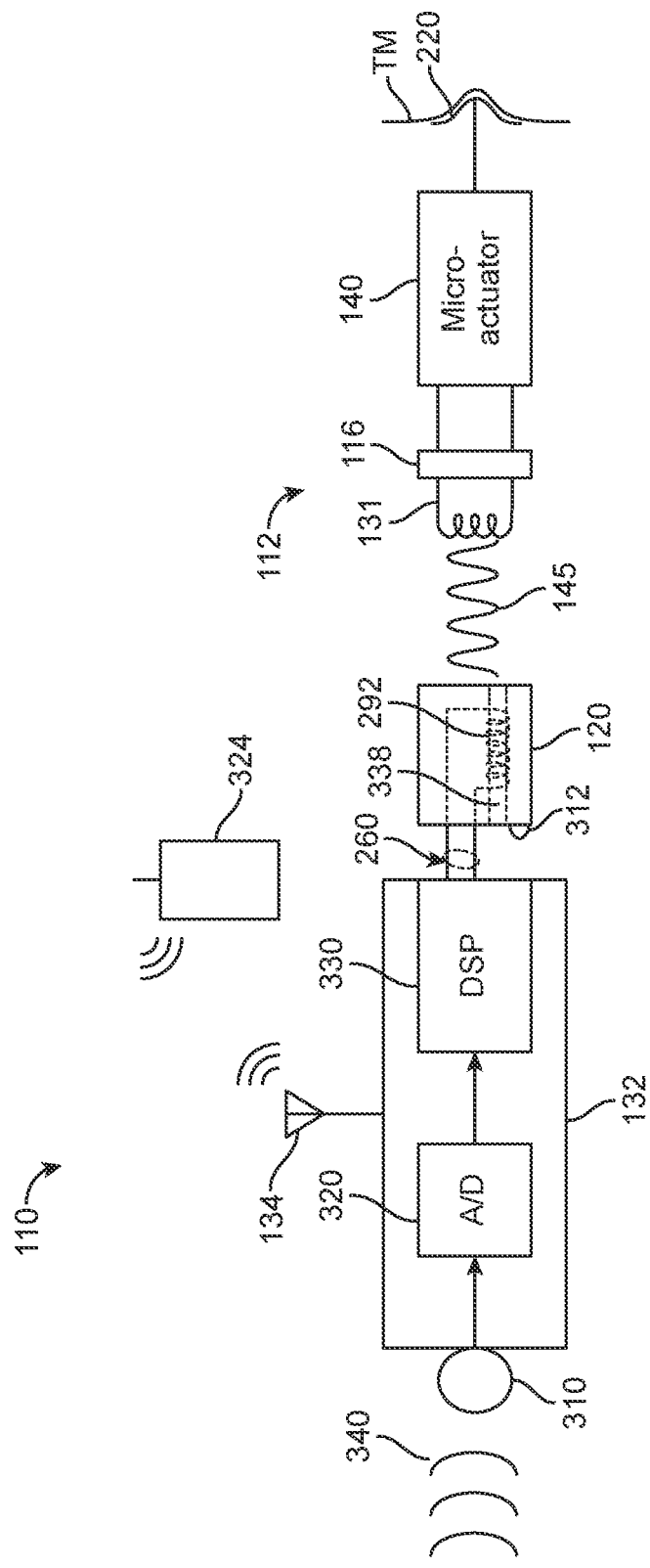
FIG. 4 is a block diagram of an inductively coupled contact hearing system for use in the present invention.

FIG. 4 is a block diagram of a contact hearing system 110 for use in the present invention. In embodiments of the invention, at least a portion of contact hearing system 110 is positioned in the ear canal of a user. In FIG. 4, acoustic input 340 may be received by external microphone 310 of audio processor 132, which then processes the received sound by passing it through processing circuitry, which may include analog to digital converter 320 and signal processor 330. The output of audio processor 132 may be transmitted to an ear tip 120 by cable 260. Signals transmitted to ear tip 120 may then be transmitted to contact hearing device 112 by, for example, causing transmit coil 292 to radiate electromagnetic waves 145. In embodiments of the invention, contact hearing device 112 may include receive coil 131, demodulator 116, microactuator 140, and umbo lens 220. Information contained in electromagnetic waves 145 received by receive coil 131 may be transmitted through demodulator 116 to microactuator 140, moving umbo lens 220. In embodiments of the invention, the signal transmitted to ear tip 120 may be a signal representative of the received audio signal, which may then be transmitted to contact hearing device 112. In embodiments of the invention, transmit coil 292 may be wound around an acoustic vent 338 in ear tip 120. In embodiments of the invention, acoustic vent 338 may be formed as a passage through a ferrite material. In embodiments of the invention, transmit coil 292 may be wound around ferrite material positioned in ear tip 120. In embodiments of the invention, contact hearing system 110 may include one or more external communication and control devices 324, such as, for example, a cell phone. In embodiments of the invention, audio processor 132 may communicate with external communication and control devices 324 by, for example, using audio processor antenna 134. Umbo lens 220 may be positioned to contact tympanic membrane TM. Ear tip 120 may include canal microphone 312.

Figure 5:
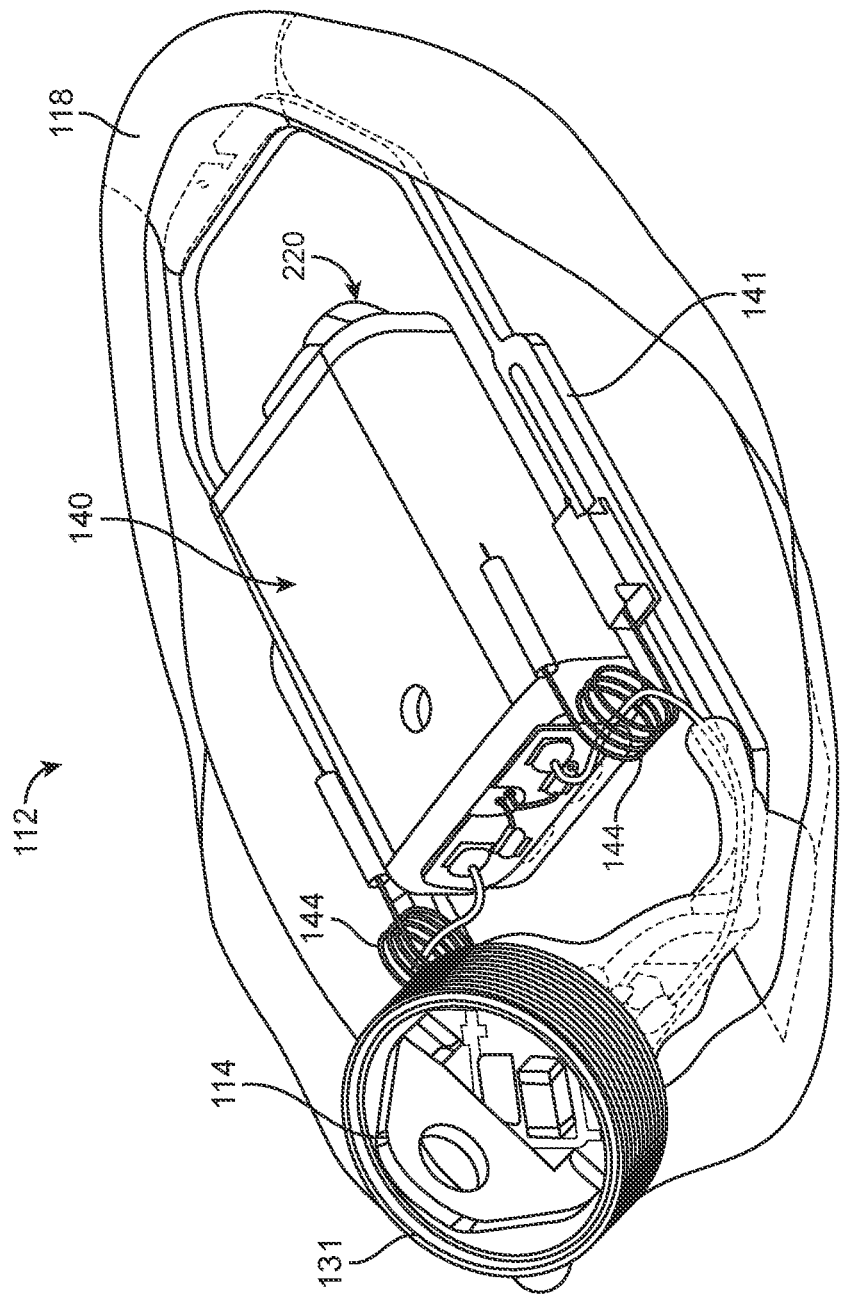
FIG. 5 is a top view of an inductively coupled contact hearing device for use in systems and methods according to the present invention.
Figure 6:
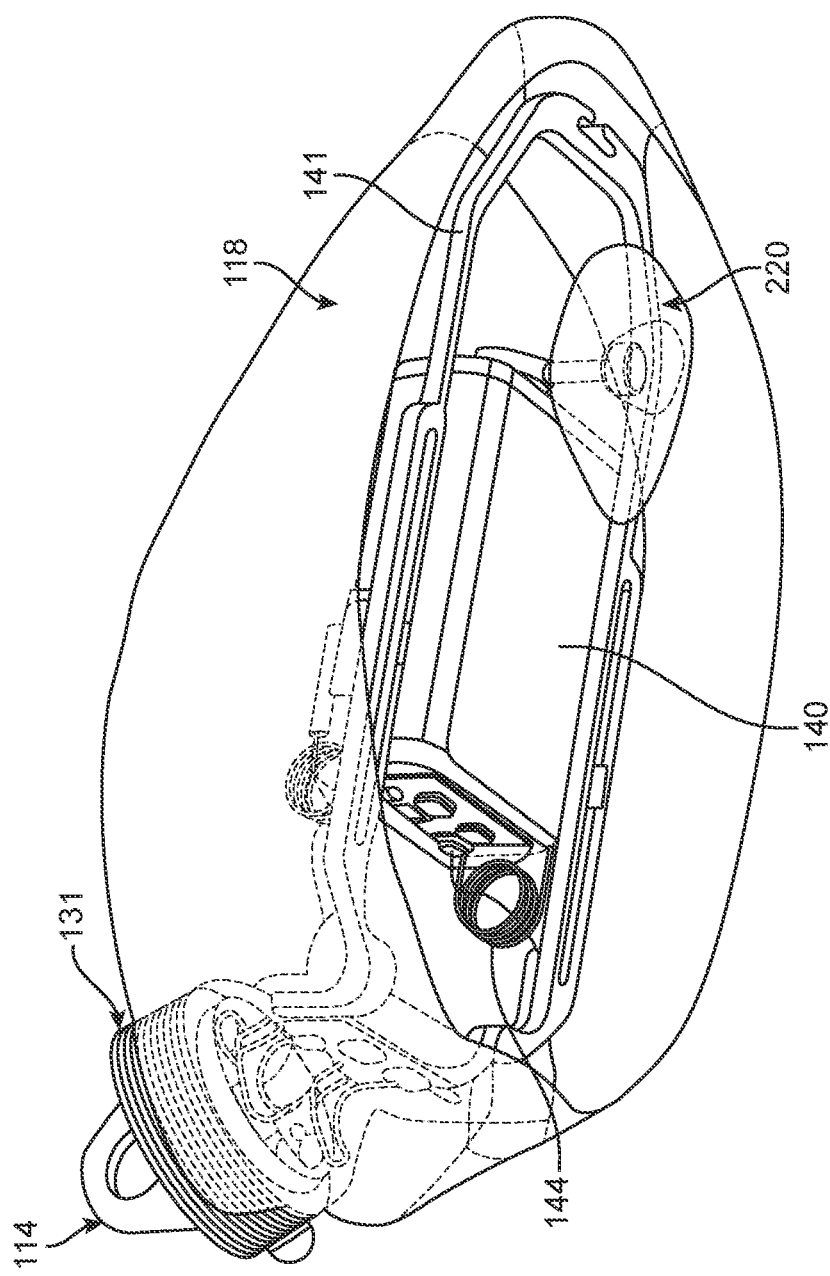
FIG. 6 is a bottom view of an inductively coupled contact hearing device for use in systems and methods according to the present invention.

FIG. 5 is a top view of a contact hearing device 112 according to the present invention. FIG. 6 is a bottom view of a contact hearing device 112 according to the present invention. The contact hearing device 112 illustrated in FIGS. 5 and 6 includes a receive coil 131, a microactuator 140, an umbo lens 220, a support structure 141, and springs 144. In the embodiment illustrated in FIGS. 5 and 6, microactuator 140 is connected to support structure 141 by springs 144. In embodiments of the invention, contact hearing device 112 may further include a sulcus platform 118, which may also be referred to as a mounting platform, connected to support structure 141 and adapted to assist in positioning contact hearing device 112 in the ear canal of a user. In embodiments of the invention, contact hearing device 112 may further include grasping tab 114.

Figure 7:
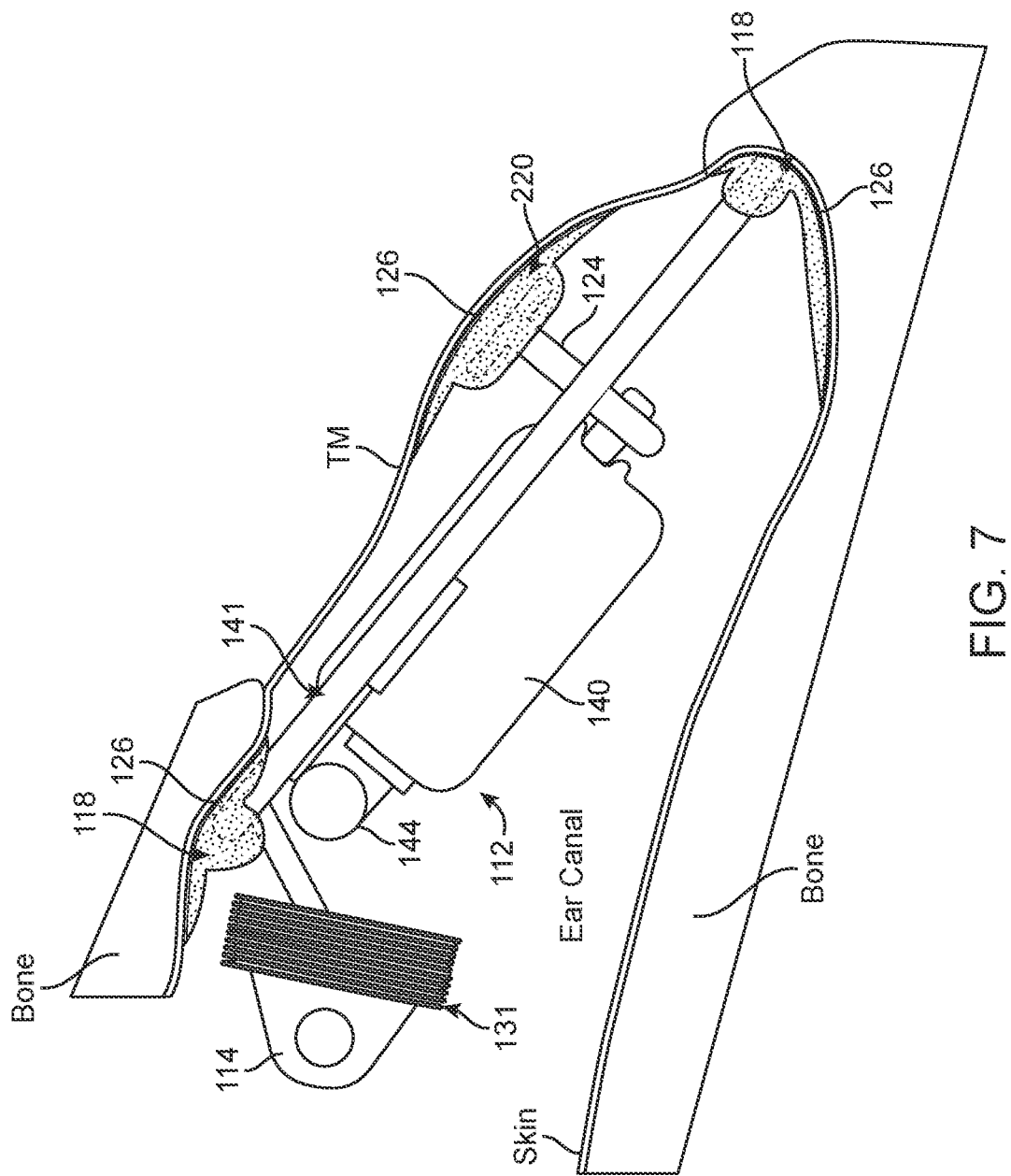
FIG. 7 is a cutaway view of an ear canal illustrating the positioning of an inductively coupled contact hearing device for use in systems and methods according to the present invention.

FIG. 7 is a cutaway view of an ear canal illustrating the positioning of a contact hearing device 112 according to the present invention. In the embodiment of FIG. 7, contact hearing device 112 is positioned at a medial end of the ear canal, proximate the tympanic membrane of the user. Contact hearing device 112 includes a receive coil 131 positioned at a proximal end thereof. In embodiments of the invention, receive coil 131 may be positioned to receive signals from an ear tip (not shown) positioned in the ear canal lateral to the position of contact hearing device 112. In embodiments of the invention, signals received by receive coil 131 may be transmitted to microactuator 140 to move drive post 124 which is connected to the user's tympanic membrane through umbo lens 220. Umbo lens 220 may be in direct physical contact with the tympanic membrane or a thin layer of oil 126 may be used between umbo lens 220 and the user's tympanic membrane. Sulcus platform 118 may be used to properly position contact hearing device 112 in the user's ear canal through contact with a skin layer which lines the ear canal. Sulcus platform 118 may be in direct contact with the skin of the ear canal, or a thin layer of oil 126 may be used between sulcus platform 118 and the skin of the ear canal. In embodiments of the invention, contact hearing device 112 may further include support structure 141, grasping tab 114 and springs 144.

Figure 8:
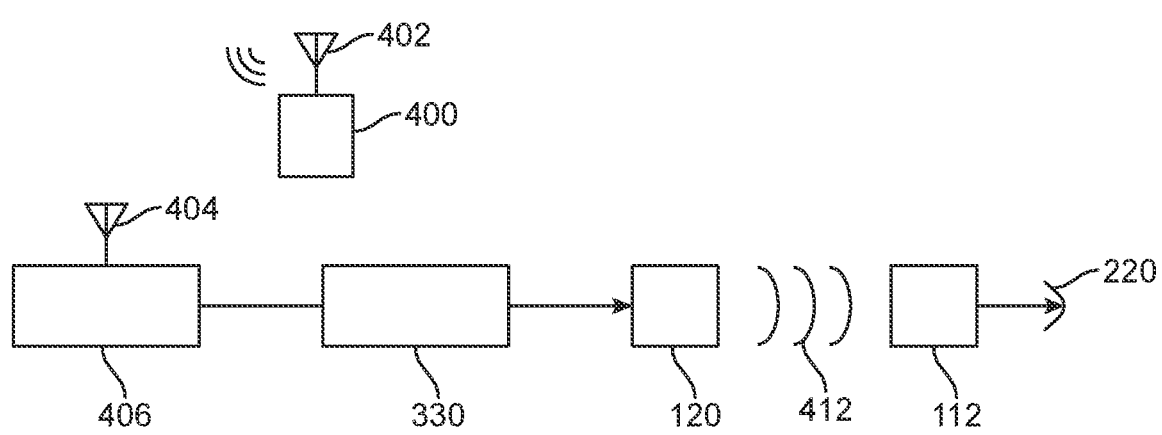
FIG. 8 is a system wherein a data transmission device (e.g., a cell phone) is transmitting a data stream to a contact hearing system including an ear tip and a contact hearing device according to the present invention.

FIG. 8 is a system wherein a data transmission device such as a cell phone is transmitting a data stream to a contact hearing system including an ear tip and a contact hearing device according to the present invention. In FIG. 8, data transmission device 400 includes a data transmission antenna 402 from which data, such as streaming audio, may be transmitted to a receiver antenna 404, which is connected to receiver 406. The output of receiver 406 may be transmitted to signal processor 330. Signal processor 330 may include a sampling rate converter and a digital signal processor. The output of signal processor 330 may be transmitted to ear tip 120, which may transmit the output of signal processor 330 via transmitted signal 412. Transmitted signal 412 may comprise light pulses or other electromagnetic waves, including radio waves and inductively coupled waves. Transmitted signal 412 may be received by contact hearing device 112 and converted to mechanical energy to drive a tympanic membrane through, for example, umbo lens 220.

Figure 9:
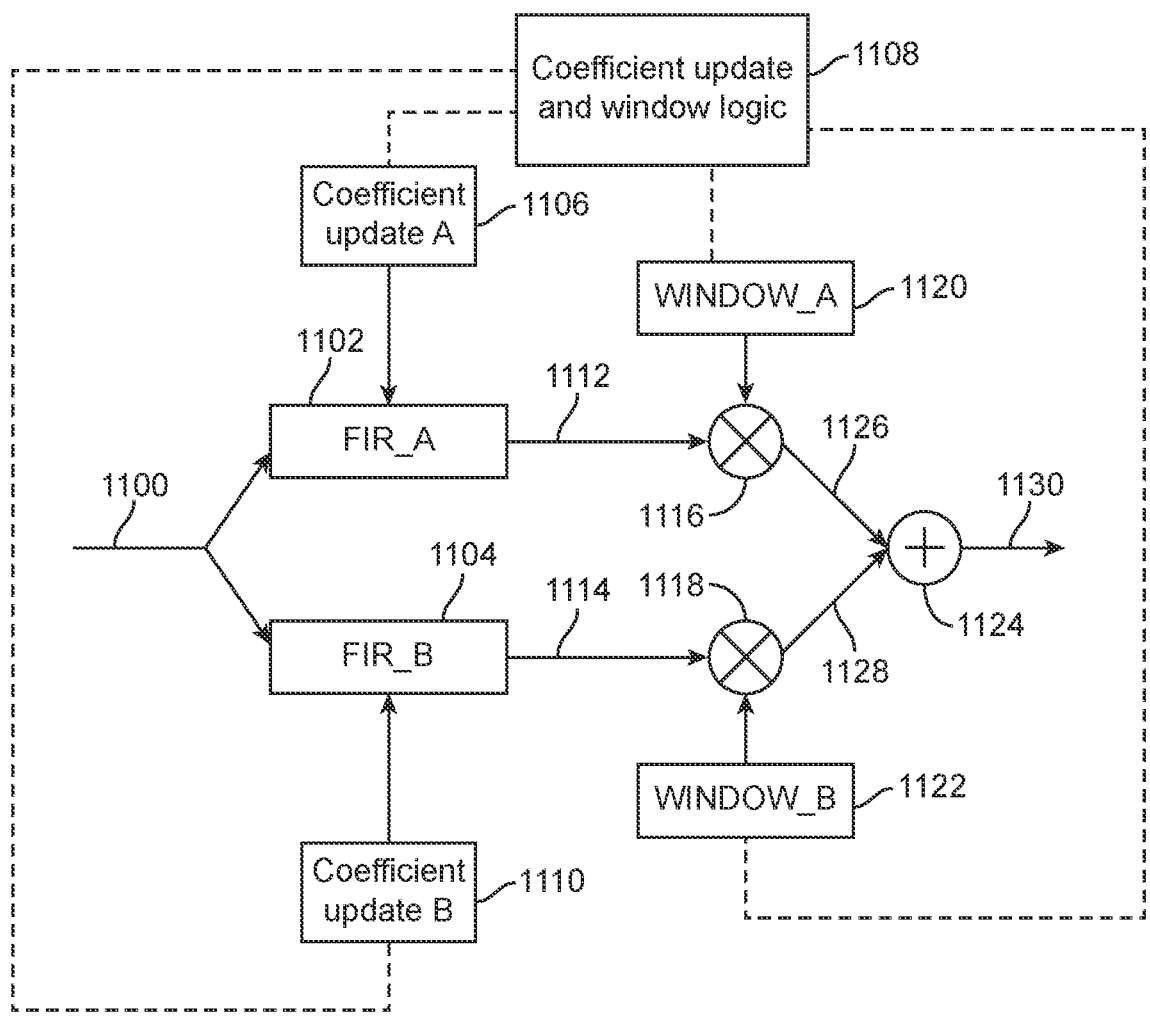
FIG. 9 is a block diagram of a dual FIR dynamic filter according to the present invention.

In FIG. 9 an input signal 1100 is received by filter A 1102 and filter B 1104. Coefficient values 1106 are fed into filter A by coefficient update and window logic 1108. Coefficient values 1110 are fed into filter B by coefficient update and window logic 1108. Output 1112 of filter A is transmitted to one input of multiplier 1116. Output 1114 of filter B is transmitted to one input of multiplier 1118. A second input of multiplier 1116 receives a window A value 1120 which is generated by coefficient and update logic 1108. A second input of multiplier 1118 receives a window B value which is generated by coefficient update and window logic 1108. Output 1126 of multiplier 1116 is summed with output 1128 of multiplier 1118 in summing circuit 1124 to generate filter system output 1130.

Figure 10:
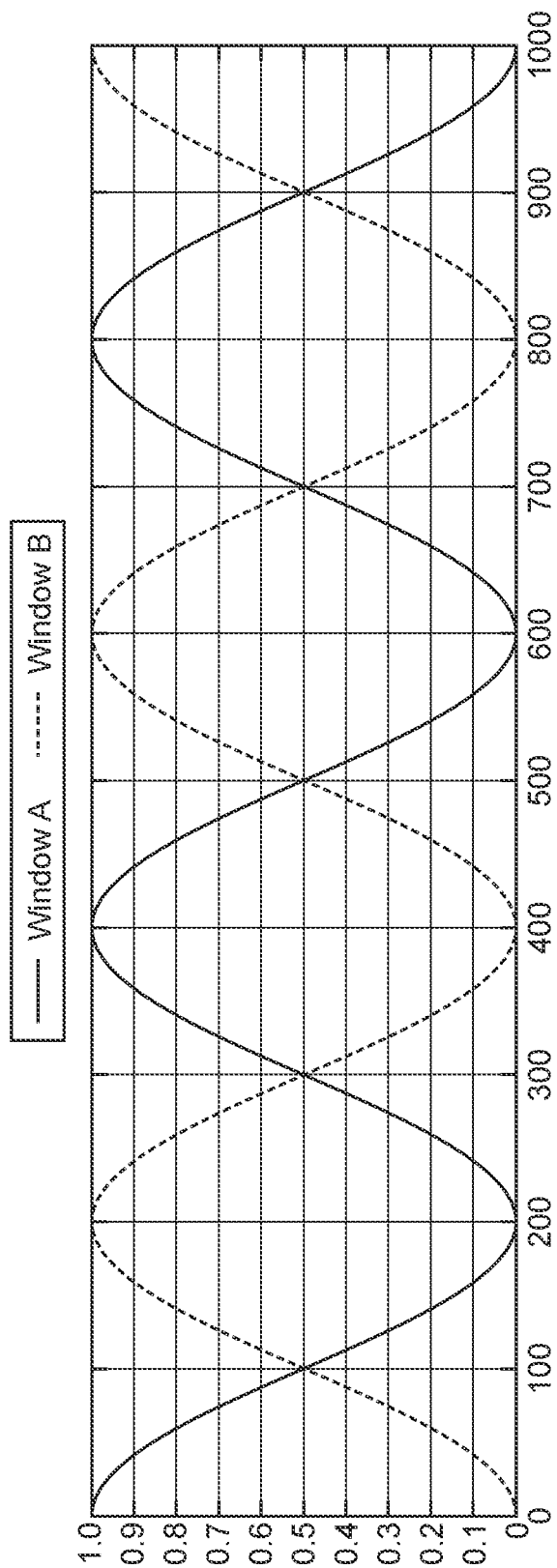
FIG. 10 is a graph illustrating the relative values of window A and window B in a dual FIR dynamic filter according to the present invention.

FIG. 10 is a graph illustrating the relative values of window A and window B in a dual FIR dynamic filter according to the present invention.

Figure 11:
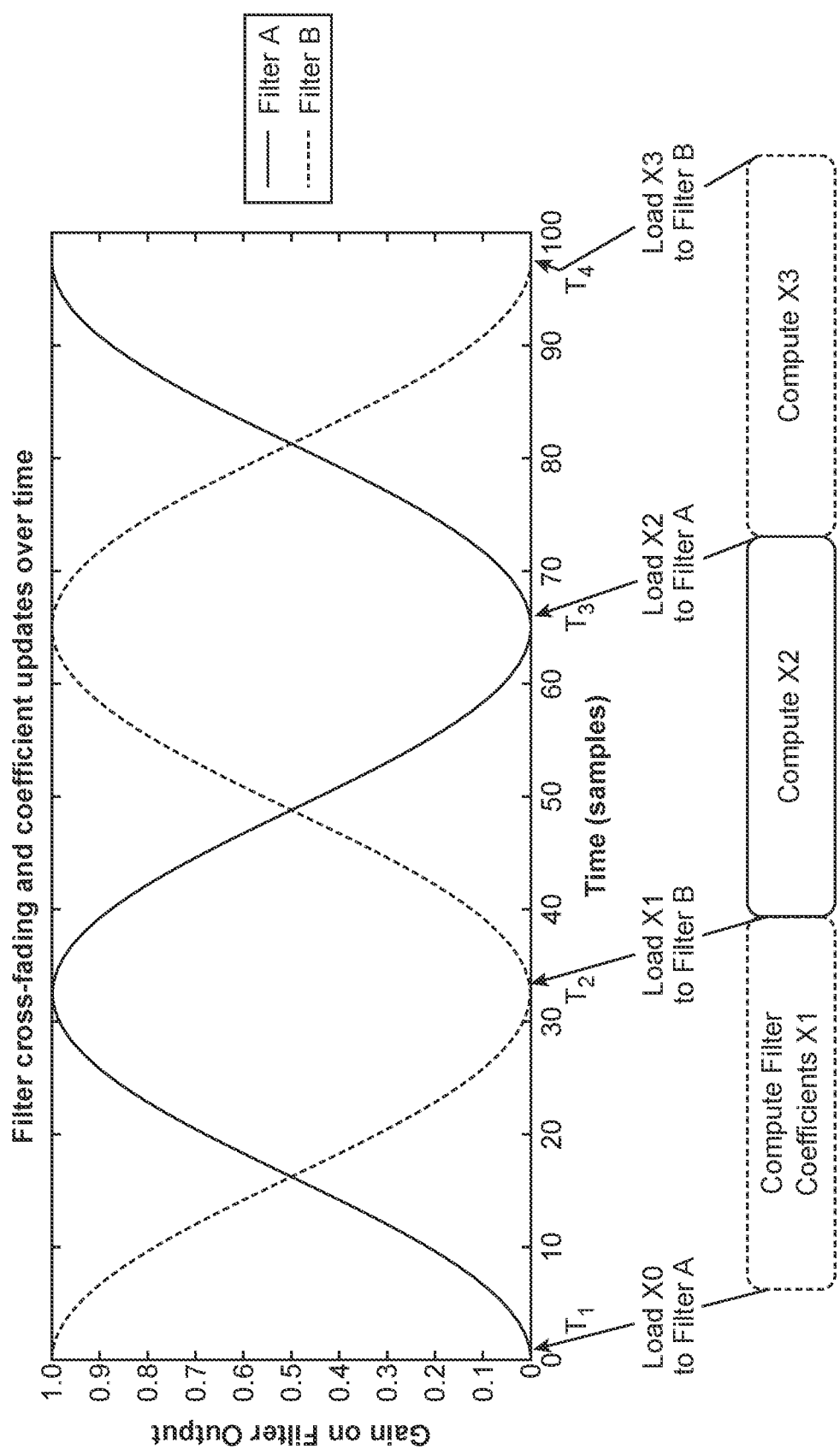
FIG. 11 is a graph illustrating the timing of the interaction of the window A and B values with the filter coefficients in a dual FIR dynamic filter according to the present invention.

FIG. 11 is a graph illustrating the timing of the interaction of the window A and B values with the filter coefficients. In the embodiment of FIG. 11, filter coefficients X0 are loaded into filter A at time T1. Note that, in the graph illustrated in FIG. 11, filter B would have received its most recent update prior to time T1. At time T1, the value of window A is zero, thus the output of filter A will have no impact on the overall filter system output. Between time T1 and time T2, a new set of filter coefficients X1 are calculated while the relative contribution of the output of filter A to the overall system output increases in accordance with the value of window A, while the relative contribution of the output of filter B declines with the value of window B. At time T2, the contribution of filter B has declined to zero and the filter system output is made up of the output of filter A. At time T2, the newly calculated coefficients X1 are loaded into filter B. Because the filter system output is comprised of only the output of filter A, when the new coefficients are loaded, any anomalies or audible artifacts caused by updating the coefficients in filter B will not be present in the filter system output.

A dual FIR filter system according to the present invention is depicted in FIG. 9. In embodiments of the invention, two FIR filters operate in parallel; that is, they are applied simultaneously to the same input signal after which a tapered window is applied to the output of each filter. In the embodiment of FIG. 9, the windows are complementary, in the sense that their sum is always equal to one. In one embodiment of the invention, when Window A has a value of 1.0 (no attenuation of the output of filter FIR A), Window B then has the value 0.0 (full attenuation of filter FIR B). As the value of Window A tapers to 0, the value of Window B simultaneously rises to 1. As illustrated in FIG. 10, the two windows alternate in this manner, with one window always approaching 1, and the other always approaching 0, so that when one filter's output is completely un-attenuated, the other is fully attenuated. It will be apparent that other waveforms, such as, for example complementary step function waveforms may be uses to achieve the goal of having Window B have a value of 1 when Window B has a value of zero.

As illustrated in FIG. 11, between time T2 and time T3 a new set of filter coefficients X2 are calculated while the relative contribution of the output of filter B to the overall filter system output increases in accordance with the value of window B, while the relative contribution of the output of filter A declines with the value of window A. At time T3, the contribution of filter A has declined to zero and the filter system output is made up of the output of filter B. At time T3, the newly calculated coefficients X2 are loaded into filter A. Because the filter system output is comprised of only the output of filter B, when the new coefficients are loaded, any anomalies or audible artifacts caused by updating the coefficients in filter A will not be present in the filter system output.

As illustrated in FIG. 11, between time T3 and time T4 a new set of filter coefficients X3 are calculated while the relative contribution of the output of filter A to the overall filter system output increases in accordance with the value of window A, while the relative contribution of the output of filter B declines with the value of window B. At time T4, the contribution of filter B has declined to zero and the filter system output is made up of the output of filter A. At time T4, the newly calculated coefficients X1 are loaded into filter B. Because the filter system output is comprised of only the output of filter A, when the new coefficients are loaded, any anomalies or audible artifacts caused by updating the coefficients in filter B will not be present in the filter system output.

The present invention renders artifacts caused by changes in the FIR filter coefficients inaudible by applying the coefficient changes only during the time when the corresponding filter is fully attenuated by its window. That is, a filter is changed only when its output is inaudible. When the window rises and that filter is no longer attenuated, any transient artifacts due to the coefficient changes are likely to have passed, and the coefficients in the other (now attenuated) filter can safely be changed. In this way, coefficients in one filter are changed only while its output is inaudible.

In embodiments of the invention, there is added latency in the application of gain changes, so this invention is most appropriate in an application in which some gain changes can be smooth and slow relative to the coefficient update rate. As an example, embodiments of the present invention may include the use of dual dynamic FIR filters in hearing aids which utilize Wide Dynamic Range Compression (WDRC).

In embodiments of the invention, the output of two windowed filters are summed to compose the overall system output. The complementary nature of the two windows ensures that the amplitude modulation of the individual filter output signals is not audible. Coefficient changes that dynamically apply frequency-dependent gain are applied to the filters alternately, and only when the corresponding filter output (and any consequent artifacts) are fully attenuated and therefore inaudible. In systems according to the present invention, filter coefficient changes are calculated on a block basis (every N samples, where N>1), and the window period is equal to twice the block length (2*N), so that filters are updated (coefficients changed) in alternate blocks.

Embodiments of the present invention may be applied to any dynamic filter system requiring real time coefficient changes, including recursive filters, such as, for example infinite impulse response (IIR) filters. In such recursive filters, artifacts due to coefficient changes will be attenuated as long as the impulse response of the filter is concentrated near zero delay. A recursive filter with a sharp resonance, for example, may not benefit as much from the current invention as a minimum phase FIR filter. In embodiments of the invention, including those used with recursive filters, more than 2 windows and filters may be employed to increase the time elapsed between coefficient updates and audibility of the output of the corresponding filter. In embodiments of the invention, the use of more than two windows and filters may result in additional expense, complexity, and gain latency.

In embodiments of the invention, the invention may be used as a component of, or method in, a contact hearing system.

Embodiments of the present invention are directed to a signal filter system for use in a contact hearing system, the signal filter system including: a signal input connected to a first filter and a second filter; a first coefficient input connected to the first filter; a second coefficient input connected to the second filter; coefficient update and window logic connected to the first and second coefficient inputs; a first window generator connected to the coefficient update and window logic; a second window generator connected to the coefficient update and window logic; a first multiplier receiving inputs from the first filter and the first window generator; a second multiplier receiving inputs from the second filter and the second window generator; and a summing circuit receiving inputs from the first and second multiplier circuits. Embodiments of the invention may further include a signal filter wherein the first and second filters are FIR filters.

Embodiments of the present invention are directed to a method for filtering a signal in a contact hearing system, wherein the method comprises the steps of: providing the signal simultaneously to a first filter and a second filter; providing the first filter with a first coefficient for use in filtering the input signal, wherein the first coefficient is provided to the first filter at a first time; providing the second filter with a second coefficient for use in filtering the input signal at a second time, wherein the second time is after the first time; multiplying an output of the first filter by a first window value to get a first filter value; multiplying an output of the second filter by a second window value to get a second filter value; and adding the first filter value to the second filter value. Embodiments of the present invention are further directed to a method wherein the first time occurs when the first window value is at or near a minimum value. Embodiments of the present invention are further directed to a method wherein the first time occurs when the first window value is substantially equal to zero. Embodiments of the present invention are further directed to a method wherein the second time occurs when the second window value is at or near a minimum value. Embodiments of the present invention are further directed to a method wherein the second time occurs when the second window value is substantially equal to zero. Embodiments of the present invention are further directed to a method wherein the first time occurs when the first window value is less than the second window value. Embodiments of the present invention are further directed to a method wherein the second time occurs when the second window value is less than the first window value.

Embodiments of the present invention are directed to a method for filtering a signal in a contact hearing system, wherein the method comprises the steps of: providing the signal simultaneously to a first filter and a second filter; changing at least one coefficient in the first filter to a first coefficient, wherein the first coefficient is changed in the first filter at a first time; changing at least one coefficient in the second filter to a second coefficient, wherein the second coefficient it changed in the second filter at a second time, and wherein the second time is after the first time; multiplying an output of the first filter by a first window value to get a first filter value; multiplying an output of the second filter by a second window value to get a second filter value; and adding the first filter value to the second filter value.

DEFINITIONS

Audio Processor—A system for receiving and processing audio signals. Audio processors may include one or more microphones adapted to receive audio which reaches the user's ear. The audio processor may include one or more components for processing the received sound. The audio processor may include digital signal processing electronics and software which are adapted to process the received sound. Processing of the received sound may include amplification of the received sound. The output of the audio processor may be a signal suitable for driving a laser located in an ear tip. The output of the audio processor may be a signal suitable for driving an antenna located in an ear tip. The output of the audio processor may be a signal suitable for driving an inductive coil located in an ear tip. Audio processors may also be referred to as behind the ear units or BTEs.

Contact Hearing System—A system including a contact hearing device, an ear tip and an audio processor. Contact hearing systems may also include an external communication device. An example of such system is an Earlens hearing-aid that transmits audio signal by laser to a contact hearing device which is located on or adjacent to the ear drum. The contact hearing system may also be referred to as a smart lens.

Contact Hearing Device—A tiny actuator connected to a customized ring-shaped support platform that floats on the ear canal around the eardrum, where the actuator directly vibrates the eardrum causing energy to be transmitted through the middle and inner ears to stimulate the brain and produce the perception of sound. The contact hearing device may comprise a photodetector, a microactuator connected to the photodetector, and a support structure supporting the photodetector and microactuator. The contact hearing device may comprise an antenna, a microactuator connected to the antenna, and a support structure supporting the antenna and microactuator. The contact hearing device may comprise a coil, a microactuator connected to the coil, and a support structure supporting the coil and microactuator. The contact hearing device may also be referred to as a Tympanic Contact Actuator (TCA), a Tympanic Lens, a Tympanic Membrane Transducer (TMT), or a smart lens.

Ear Tip—A structure designed to be placed into and reside in the ear canal of a user, where the structure is adapted to receive signals from an audio processor and transmit signals to the user's tympanic membrane or to a device positioned on or near the user's tympanic membrane (such as, for example, a contact hearing device). In one embodiment of the invention, the signals may be transmitted by light, using, for example, a laser positioned in the light tip. In one embodiment of the invention, the signals may be transmitted using radio frequency, using, for example, an antenna connected to the Ear Tip. In one embodiment of the invention, the signal may be transmitted using inductive coupling, using, for example, a coil connected to the ear tip. The ear tip may also be referred to as a light tip, magnetic tip, or mag tip.

Light-Driven Hearing Aid System—A contact hearing system wherein signals are transmitted from an ear tip to a contact hearing device using light. In a light driven hearing system, light (e.g. laser light) may be used to transmit information, power, or both information and power to a contact hearing device.

RF-Driven Hearing Aid System—A contact hearing system wherein signals are transmitted from an ear tip to a contact hearing device using radio frequency electromagnetic radiation. In an RF driven hearing system, electromagnetic radiation may be used to transmit information, power, or both information and power from the ear tip to the contact hearing device.

Inductively-Driven Hearing Aid System—A contact hearing system wherein signals are transmitted from an ear tip to a contact hearing device using inductive coupling. In an inductively driven hearing system, magnetic waves may be used to transmit information, power, or both information and power from the ear tip to the contact hearing device.

Light Tip—An ear tip adapted for use in a light driven hearing aid system. A light tip may include a laser.

Mag Tip—An ear tip adapted for use in an inductively driven hearing aid system. The mag tip may include an inductive transmit coil.

While the preferred embodiments of the devices and methods have been described in reference to the environment in which they were developed, they are merely illustrative of the principles of the present inventive concepts. Modification or combinations of the above-described assemblies, other embodiments, configurations, and methods for carrying out the invention, and variations of aspects of the invention that are obvious to those of skill in the art are intended to be within the scope of the claims. In addition, where this application has listed the steps of a method or procedure in a specific order, it may be possible, or even expedient in certain circumstances, to change the order in which some steps are performed, and it is intended that the particular steps of the method or procedure claim set forth herebelow not be construed as being order-specific unless such order specificity is expressly stated in the claim.

REFERENCE NUMBERS

| Number | Element |
| --- | --- |
| 110 | Contact Hearing System |
| 112 | Contact Hearing Device |
| 114 | Grasping Tab |
| 116 | Demodulator |
| 118 | Sulcus Platform |
| 120 | Ear Tip/Light Tip/Mag Tip |
| 124 | Drive Post |
| 126 | Oil Layer |
| 130 | Photodetector |
| 131 | Receive Coil |
| 132 | Audio Processor |
| 134 | Audio Processor Antenna |
| 140 | Microactuator |
| 141 | Support Structure |
| 142 | Light Pulses |
| 145 | Electromagnetic Waves |
| 144 | Springs |
| 220 | Umbo Lens |
| 250 | Taper Tube |
| 260 | Cable |
| 290 | Light Source |
| 292 | Transmit Coil |
| 310 | External Microphone |
| 312 | Canal Microphone |
| 320 | Analog to Digital Converter |
| 324 | External Communication and Control Device |
| 330 | Signal Processor |
| 338 | Acoustic Vent |
| 340 | Acoustic Input (Audible Sound) |
| 400 | Data Transmission Device |
| 402 | Data Transmission Antenna |
| 404 | Receiver Antenna |
| 406 | Receiver |
| 412 | Transmitted Signal |
| TM | Tympanic Membrane |
| 1100 | Input Signal |
| 1102 | Filter A |
| 1104 | Filter B |
| 1106 | Coefficient Values for Filter A |
| 1108 | Coefficient Update and Windows Logic |
| 1110 | Coefficient Values for Filter B |
| 1112 | Output of Filter A |
| 1114 | Output of Filter B |
| 1116 | Multiplier |
| 1118 | Multiplier |
| 1120 | Window A Value |
| 1122 | Window B Value |
| 1124 | Summing Circuit |
| 1126 | Output of Multiplier 11116 |
| 1128 | Output of Multiplier 11118 |
| 1130 | Filter System Output |

The invention claimed is:

1. A signal filter system for use in a contact hearing system using inductive coupling to transmit information and/or power from an ear tip to a contact hearing device, the signal filter system comprising:
   a signal input connected to a first filter and a second filter;
   a first coefficient input connected to the first filter;
   a second coefficient input connected to the second filter;
   a coefficient update and window logic connected to the first and second coefficient inputs;
   a first window generator connected to the coefficient update and window logic;
   a second window generator connected to the coefficient update and window logic;
   a first multiplier receiving inputs from the first filter and the first window generator;
   a second multiplier receiving inputs from the second filter and the second window generator; and a summing circuit receiving inputs from the first and second multiplier circuits; and
   the contact hearing device comprising:
   a receive coil;
   a microactuator; and
   an umbo lense.

2. A signal filter system according to claim 1, wherein the first and second filters are FIR filters.

3. A method for filtering a signal in a contact hearing system using inductive coupling to transmit information and/or power from an ear tip to a contact hearing device, wherein the method comprises the steps of:
   providing the signal simultaneously to a first filter and a second filter;
   providing the first filter with a first coefficient for use in filtering the input signal, wherein the first coefficient is provided to the first filter at a first time;
   providing the second filter with a second coefficient for use in filtering the input signal at a second time, wherein the second time is after the first time;
   multiplying an output of the first filter by a first window value to get a first filter value;
   multiplying an output of the second filter by a second window value to get a second filter value; and
   adding the first filter value to the second filter value.

4. A method according to claim 3, wherein the first time occurs when the first window value is at or near a minimum value.

5. A method according to claim 4, wherein the first time occurs when the first window value is substantially equal to zero.

6. A method according to claim 3, wherein the second time occurs when the second window value is at or near a minimum value.

7. A method according to claim 6, wherein the second time occurs when the second window value is substantially equal to zero.

8. A method according to claim 3, wherein the first time occurs when the first window value is less than the second window value.

9. A method according to claim 8, wherein the second time occurs when the second window value is less than the first window value.

10. A method for filtering a signal in a contact hearing system using inductive coupling to transmit information and/or power from an ear tip to a contact hearing device, wherein the method comprises the steps of:
   providing the signal simultaneously to a first filter and a second filter;
   changing at least one coefficient in the first filter to a first coefficient, wherein the first coefficient is changed in the first filter at a first time;
   changing at least one coefficient in the second filter to a second coefficient, wherein the second coefficient it changed in the second filter at a second time, and wherein the second time is after the first time;
   multiplying an output of the first filter by a first window value to get a first filter value;
   multiplying an output of the second filter by a second window value to get a second filter value; and
   adding the first filter value to the second filter value.

* * * * *